(12) United States Patent
Shah et al.

(10) Patent No.: US 10,114,690 B2
(45) Date of Patent: Oct. 30, 2018

(54) MULTI-DIE STATUS MODE FOR NON-VOLATILE STORAGE

(71) Applicant: SanDisk Technologies Inc., Plano, TX (US)

(72) Inventors: Grishma Shah, Milpitas, CA (US); Jack Frayer, Boulder Creek, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/042,169

(22) Filed: Feb. 12, 2016

(65) Prior Publication Data
US 2016/0239373 A1  Aug. 18, 2016

Related U.S. Application Data

(60) Provisional application No. 62/116,334, filed on Feb. 13, 2015.

(51) Int. Cl.
*G06F 11/07* (2006.01)

(52) U.S. Cl.
CPC ........ *G06F 11/0793* (2013.01); *G06F 11/073* (2013.01); *G06F 11/079* (2013.01); *G06F 11/0751* (2013.01)

(58) Field of Classification Search
CPC ............. G06F 11/0751; G06F 11/0793; G06F 11/079; G06F 11/08; G06F 11/073; G06F 11/22; G06F 11/076; G06F 11/068; G06F 11/1068; G06F 13/1694; G06F 3/061; G06F 3/0604; G06F 3/0653; G06F 2212/7208; G06F 2212/202
See application file for complete search history.

(56) References Cited

U.S. PATENT DOCUMENTS

| | | | |
|---|---|---|---|
| 5,438,536 A | 8/1995 | Salzman | |
| 5,457,787 A | 10/1995 | Asano | |
| 5,579,262 A | 11/1996 | Song | |
| 5,640,349 A | 6/1997 | Kakinuma | |
| 6,249,461 B1 | 6/2001 | Choi | |
| 6,442,076 B1* | 8/2002 | Roohparvar | G11C 16/10 365/185.33 |
| 7,809,901 B2* | 10/2010 | Huber | G11C 7/1045 377/26 |

(Continued)

OTHER PUBLICATIONS

Response to Office Action filed May 8, 2017 in U.S. Appl. No. 14/929,004.

(Continued)

*Primary Examiner* — Nadeem Iqbal
(74) *Attorney, Agent, or Firm* — Vierra Magen Marcus LLP

(57) ABSTRACT

Systems and methods are provided for acquiring status information from a plurality of memory die. An apparatus is provided that includes a plurality of memory die and a memory controller. The memory controller is configured to broadcast a first status command to the plurality of memory die, receive a first status response concurrently from the plurality of memory die based on the first status command, and send a repair command to one or more of the plurality of memory die in response to the first status response not satisfying first predetermined status criteria.

20 Claims, 18 Drawing Sheets

(56) References Cited

U.S. PATENT DOCUMENTS

| | | | |
|---|---|---|---|
| 7,843,758 B2 * | 11/2010 | Byeon | G06F 13/1684 365/185.11 |
| 7,865,657 B2 | 1/2011 | Kim | |
| 7,966,445 B2 | 6/2011 | Hobler | |
| 8,144,496 B2 | 3/2012 | Cheng | |
| 8,266,361 B1 | 9/2012 | Jikku | |
| 8,819,328 B2 | 8/2014 | Lassa | |
| 8,843,692 B2 | 9/2014 | Oh | |
| 8,923,065 B2 | 12/2014 | Prasad | |
| 9,003,102 B2 | 4/2015 | Lassa | |
| 2002/0188897 A1 * | 12/2002 | Ruckerbauer | G11C 29/78 714/710 |
| 2008/0209077 A1 | 8/2008 | Im | |
| 2008/0215771 A1 * | 9/2008 | Osaki | G06F 11/2097 710/46 |
| 2009/0125762 A1 * | 5/2009 | Wang | G11C 29/56 714/718 |
| 2010/0165748 A1 | 7/2010 | Thiruvengadam | |
| 2011/0299317 A1 | 12/2011 | Shaeffer | |
| 2013/0254467 A1 * | 9/2013 | Parizi | G06F 12/0246 711/103 |
| 2013/0326090 A1 | 12/2013 | Gillingham | |
| 2013/0339555 A1 | 12/2013 | Schushan | |
| 2013/0339638 A1 | 12/2013 | Lazmi | |
| 2014/0047158 A1 | 2/2014 | Frans | |
| 2014/0250262 A1 | 9/2014 | Buxton | |
| 2015/0067232 A1 * | 3/2015 | Fontana | G06F 12/0246 711/103 |
| 2015/0100744 A1 * | 4/2015 | Mirichigni | G06F 12/023 711/154 |
| 2015/0134882 A1 | 5/2015 | Lin | |
| 2015/0134883 A1 | 5/2015 | Lin | |
| 2015/0134884 A1 | 5/2015 | Lin | |
| 2015/0187399 A1 | 7/2015 | Tuers | |
| 2015/0261452 A1 | 9/2015 | Moon | |
| 2016/0092116 A1 * | 3/2016 | Liu | G11O 5/025 711/103 |

OTHER PUBLICATIONS

Kang, et al., "A multi-channel architecture for high-performance NAND flash-based storage system" Korea Advanced Institute of Science and Technology, Dec. 9, 2005.

Cooke, "The inconvenient truths of NAND flash memory," Micron Technology, Inc., Aug. 2007.

U.S. Appl. No. 14/929,004, filed Oct. 30, 2015.

Office Action dated Dec. 16, 2016, U.S. Appl. No. 14/929,004.

Office Action dated Aug. 11, 2017, U.S. Appl. No. 14/929,004.

Notice of Allowance and Fee(s) Due dated Jan. 11, 2018 in U.S. Appl. No. 14/929,004.

* cited by examiner

410

| DIE | CADD | BIT POSITION | CE |
|---|---|---|---|
| DIE-0 | 000 | 0 | CE0 |
| DIE-1 | 001 | 1 | CE0 |
| DIE-2 | 010 | 2 | CE0 |
| DIE-3 | 011 | 3 | CE0 |
| DIE-4 | 100 | 4 | CE0 |
| DIE-5 | 101 | 5 | CE0 |
| DIE-6 | 110 | 6 | CE0 |
| DIE-7 | 111 | 7 | CE0 |

412

| DIE | CADD | BIT POSITION | CE |
|---|---|---|---|
| DIE-0 | 000 | 0 | CE0 |
| DIE-1 | 001 | 1 | CE0 |
| DIE-2 | 010 | 2 | CE0 |
| DIE-3 | 011 | 3 | CE0 |
| DIE-4 | 100 | 4 | CE1 |
| DIE-5 | 101 | 5 | CE1 |
| DIE-6 | 110 | 6 | CE1 |
| DIE-7 | 111 | 7 | CE1 |

FIG. 4

| DIE | CADD | BIT POSITION |
|---|---|---|
| DIE-0 | 000 | 0 |
| DIE-1 | 001 | 1 |
| DIE-2 | 010 | 2 |
| DIE-3 | 011 | 3 |
| DIE-4 | 100 | 4 |
| DIE-5 | 101 | 5 |
| DIE-6 | 110 | 6 |
| DIE-7 | 111 | 7 |

FIG. 7B

| DIE/PACKAGE | X | Y |
|---|---|---|
| 8 | 0 | 0 |
| 4 | 0 | 1 |
| 2 | 1 | 0 |

FIG. 7C

MULTI-DIE STATUS MODE FOR NON-VOLATILE STORAGE

PRIORITY CLAIM

This application claims priority to U.S. Provisional Application No. 62/116,334, entitled "Hard Reset Detection Using Status Command for Non-Volatile Storage," filed Feb. 13, 2015, which is incorporated by reference herein in its entirety for all purposes.

BACKGROUND

Semiconductor memory is widely used in various electronic devices such as mobile phones, digital cameras, personal digital assistants, solid-state drives, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM), including re-writable non-volatile memory cells, such as two-terminal resistive RAM (ReRAM) memories.

It is common for semiconductor memory die to be placed into a package to allow for easier handling and assembly, and to protect the die from damage. Although a plural form of "die" is "dice," it is common industry practice to use "die" as a plural form as well as the singular form. In one example, semiconductor memory die and/or other integrated circuits, such as processors, may be encased within a package wherein the die may be stacked on top of one another within the package. The package may be a surface-mount package (e.g., a BGA package or TSOP package). One benefit of vertically stacking die within a package (e.g., stacking 16 die within a single package) is that form factor and/or package size may be reduced. In some cases, the package may be a stacked multi-chip package, a system-in-package (SiP), or a chip stack multichip module (MCM). Vertical connections between the stacked die including direct vertical connections through a die's substrate (e.g., through a silcon substrate) may be formed within each die before or after die-to-die bonding.

BRIEF DESCRIPTION OF THE DRAWINGS

FIG. 4 depicts one embodiment of a chart describing various system configurations.

FIG. 7B depicts an embodiment of a chart describing various system configurations.

FIG. 7C depicts an embodiment of another chart describing various system configurations.

DETAILED DESCRIPTION

Figure 1A:
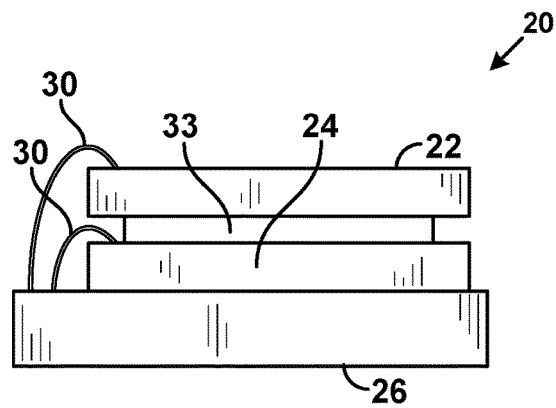
FIGS. 1A-1C depict various embodiments of a plurality of staicked die within a semiconductor package.

Technology is described for determining memory die status information following predetermined unwanted events (e.g., soft power resets, hard power resets, power drop suspends, power on read failures, word line shorts, etc.) that may cause one or more memory die in a multi-die package to no longer function properly. For example, a predetermined unwanted event may cause one or more die in a set of die to no longer recognize its unique address relative to the other die in the set. In an embodiment, a memory controller sends a status command to a plurality of memory die. Each of the memory die concurrently respond to the status command with a status response depending on whether the memory die experienced a predetermined unwanted event. As used herein, "concurrent" means existing, happening, or occurring at or about the same time. As used herein, a "status command" is a command issued by a memory controller that directs memory die to make information about the state of the memory die available to the memory controller. As used herein, a "status response" is a response flag or signal by a memory die to a status command.

If none of the plurality of memory die have experienced a predetermined unwanted event, the plurality of memory die concurrently respond with a status response that satisfies predetermined status criteria. If the plurality of memory die do not return a status response that satisfies predetermined status criteria, the memory controller determines that one or more of the plurality of memory die experienced a predetermined unwanted event, and may send a repair command to the one or more of the plurality of memory die, or may send further status commands to further determine the nature or cause of the predetermined unwanted event.

As used herein a "repair command" is one or more commands that reset one or more memory die parameters and/or cause a memory die to exit a normal operating mode and enter a limited use state or a non-operational state. Examples of repair commands include a reset command, a power on read command, a manual resume command, a power off command, a hibernate command, a standby command, a read-only command, a quarantine command, and other similar repair commands.

As used herein, "predetermined status criteria" are any criteria that when checked indicate that one or more die has experienced a predetermined unwanted event. Examples of predetermined status criteria include a predetermined bit pattern (e.g., an alternating pattern of 0s and 1s, all 0s, all 1s), a predetermined bit pattern sequence (e.g., a bit pattern in which each bit toggles at a specific frequency), and other similar predetermined status criteria.

Technology also is described for increasing performance and reducing power consumption of a non-volatile memory system while the system acquires status information from a plurality of memory die. The non-volatile memory system may include a plurality of memory die and a memory controller for controlling operations performed by each memory die of the plurality of memory die (e.g., read operations, write operations, or erase operations). The plurality of memory die may include multiple die within a package.

The memory controller may transmit or broadcast a first status command to each memory die of the plurality of memory die and in response simultaneously or concurrently receive one or more sets of status information from each memory die of the plurality of memory die.

The status information may include ready/busy status information (e.g., indicating that a memory die can receive new data), busy status information (e.g., indicating that a memory die is currently performing a memory operation), programming loop count information (e.g., indicating the number of programming loops that have been completed for a programming operation), erase loop count information (e.g., indicating the number of erase loops that have been completed for an erase operation), and status information regarding whether a particular programming state has been reached (e.g., the "A" programming state or the "F" programming state) for each memory die of the plurality of memory die.

In one embodiment, the plurality of memory die may include eight memory die and the status information may be received by the memory controller via an 8-bit bus connecting the memory controller to each of the plurality of memory die. The memory controller may concurrently receive various types of per die status information over a shared I/O bus.

For example, a first status command may specify that ready/busy status information and loop count information be transmitted from each memory die of the plurality of memory die in response to receiving the first status command. The loop count information for a first memory die may include programming loop count information and the loop count information for a second memory die may include erase loop count information. The memory controller may identify whether the loop count information corresponds with a programming loop count or an erase loop count as the memory controller may be responsible for issuing programming and erase commands to each memory die of the plurality of memory die.

The program or erase loop count may be used by the memory controller to determine how far along a memory die is to completing a programming or erase operation (e.g., the memory die has at most 10 more programming cycles before completing a programming operation) and to determine how to schedule or order future memory operations for each memory die of the plurality of memory die.

In the case of eight memory die, each bit of the 8-bit bus may be driven by one of the eight memory die at the same time. Person of ordinary skill in the art will understand that the plurality of memory die may include more or fewer than eight memory die, and the shared I/O bus may have more or fewer than 8 bits. The determination of which bit of the 8-bit bus is driven by a particular memory die of the eight memory die may be determined via bonded pin connections made at the package level.

For example, a three-bit address (referred to herein as "CADD address") identifying which bit position within the 8-bit bus should be driven by a memory die may be set by connecting three bond pads of the memory die to voltages corresponding with the three-bit CADD address. The determination of which bit of the 8-bit bus is driven by a particular memory die also may be determined via configuration information stored within non-volatile memory within the particular memory die (e.g., trimfuse bits or trimbits may be programmed within each memory die specifying a CADD address).

The memory controller may receive one or more sets of status information from each memory die of a plurality of memory die using a subset of bits of a shared I/O bus. In one embodiment, a plurality of memory die may include four memory die within a package that are connected to a memory controller via an 8-bit I/O bus and a first status command issued by the memory controller may specify that two-bits of status information are driven by each memory die of the plurality of memory die during a status information cycle.

In one example, a first memory die of the plurality of memory die may drive a first set of two bits of the 8-bit bus (e.g., bus[1:0]) and a second memory die of the plurality of memory die may drive a second set of two bits of the 8-bit bus (e.g., bus[3:2]). In one example, the first set of two bits may correspond with read or write pass/fail information for two memory planes within the first memory die and the second set of two bits may correspond with read or write pass/fail information for two memory planes within the second memory die. Memory planes may correspond with different memory arrays within a memory die.

The memory controller may broadcast a status command to the plurality of memory die corresponding with the type of status information to be transmitted from the plurality of memory die. In response, the memory controller may receive different sets of status information based on the status command broadcast to the plurality of memory die. For example, a first status command may correspond with receiving ready/busy status information and a second status command may correspond with receiving ready/busy status information followed by busy status information and loop count information.

Ready/busy status information (or cachebusy status information) may correspond with whether a memory die is able to receive new data as it has data latches that are ready to accept the new data (e.g., the memory die may be able to accept 8-bits of data to be programmed during a programming operation). Busy status information may correspond with whether a memory die is currently performing a memory operation (e.g., a programming operation or a read operation).

Although a memory die may be performing a memory operation (e.g., a programming operation) and its busy status bit is set to "1", the ready/busy status bit may be set to "0" as the memory die may have data latches available to accept new data for a subsequent memory operation. A status bit may include a status signal that is true if set to "1" and false if set to "0." In some cases, a status bit may be inverted or negated. For example, busyN may be a status signal that is true if set to "0" and false if set to "1." Similarly, cache-busyN may be a status signal that is true if set to "0" and false if set to "1."

The status information also may include plane 1 multi-level cell (MLC) program or erase status information and plane 0 MLC program or erase status information. For example, if a memory die has two memory planes and if an MLC programming operation was successful for plane 1 of the memory die, then PB1_MLC[N] may be set to "1" and if an MLC programming operation was not successful for plane 0 of the memory die, then PB0_MLC[N] may be set to "0."

In another example, if an erase operation was not successful for plane 1 of the memory die, then plane1_erase[N] may be set to "0" and if an erase operation was successful for plane 0 of the memory die, then plane0_erase[N] may be set to "1." The status information also may include plane 1 MLC program or erase status information and/or plane 0 MLC program or erase status information for a prior memory operation. In this case, a memory controller may issue a first memory command corresponding with a first memory operation to be performed by a memory die (e.g., a current operation or the Nth operation) and a second memory command corresponding with a second memory operation to be performed by the memory die (e.g., a previous operation or the N−1th operation).

In this case, the memory controller may issue a first status command and receive status information corresponding with a current operation and a previous operation for each memory die. For example, if an MLC programming operation for a current operation was successful for plane 1 of a memory die, then PB1_MLC[N] may be set to "1" and if an MLC programming operation for a previous memory operation was not successful for plane 1 of the memory die, then PB1_MLC[N−1] may be set to "0."

In one embodiment, a particular status command may cause a first memory die of a plurality of memory die to transmit only ready/busy status information and a second memory die of the plurality of memory die to transmit ready/busy status information followed by busy status information and loop count information.

In another embodiment, a particular status command may cause a first memory die of a plurality of memory die to transmit ready/busy status information during a status information cycle and a second memory die of the plurality of memory die to transmit busy status information or other status information different from ready/busy status information during the status information cycle.

In another embodiment, a particular status command may cause a first memory die of a plurality of memory die to transmit programming loop count information during a status information cycle and a second memory die of the plurality of memory die to transmit erase loop count information during the status information cycle.

In some embodiments, a particular status command broadcast by a memory controller may direct each memory die of a plurality of memory die to output status information corresponding with a memory operation state of the memory die.

In one example, a first memory die of the plurality of memory die may be performing a programming operation and output programming loop count information in response to the particular status command while a second memory die of the plurality of memory die may be performing a read operation and output ready/busy status information and/or read pass/fail status information in response to the particular status command. In this case, portions of the programming loop count and the read pass/fail status information may be concurrently received by the memory controller or received by the memory controller at the same time.

In another example, a first memory die of the plurality of memory die may be performing a programming operation and output programming loop count information in response to the particular status command while a second memory die of the plurality of memory die may be performing an erase operation and output erase loop count information in response to the particular status command.

In another embodiment, a memory controller sends a status command to each memory die of a plurality of memory die. Each of the memory die concurrently respond to the status command depending on whether the memory die experienced a predetermined unwanted event. Examples of such predetermined unwanted events include soft power resets, hard power resets, power drop suspends, power on read failures, word line shorts. Persons of ordinary skill in the art will understand that other predetermined unwanted events may be used. Based on the concurrent response from the plurality of memory die, the memory controller can determine using a single status command whether one or more of the plurality of memory die experienced a predetermined unwanted event. In addition, the concurrent response also identifies which specific die has experienced the predetermined unwanted event. This permits the memory controller to remediate the predetermined unwanted event without having to gather any additional information.

For simplicity, unless otherwise stated, the remaining discussion will describe an embodiment in which the predetermined unwanted event is a soft reset or a hard reset. In particular, a memory controller sends a status command to each memory die of a plurality of memory die to determine if any of the memory die experienced a power drop (e.g., a soft reset or a hard reset), and each of the memory die concurrently respond to the status command depending on whether the memory die experienced a soft reset or a hard reset.

In an embodiment, if a memory die has not experienced a soft reset or a hard reset (or any other predetermined unwanted event), the memory die is configured to drive its dedicated IO bit with the value of the least significant bit of the CADD address of the memory die. This creates a status response that satisfies predetermined status criteria that include, in an embodiment, a pattern of alternating 1s and 0s on the shared IO_BUS[7:0]. Memory controller 702 receives the status response concurrently from memory die DIE-0, DIE-1, . . . , DIE-7 based on status command CMD_XX.

If a memory die has experienced a predetermined unwanted event, such as a soft reset or a hard reset (or any other predetermined unwanted event), the memory die is configured to ignore the CMD_XX command and not drive its dedicated IO bit (e.g., the memory die floats its dedicated IO bit). This creates a status response that does not satisfy predetermined status criteria that include a pattern of alternating 1s and 0s on the shared IO_BUS[7:0]. Memory controller 702 receives the status response concurrently from memory die DIE-0, DIE-1, . . . , DIE-7 based on status command CMD_XX.

Persons of ordinary skill in the art will understand that the plurality of memory die may respond the status command CMD_XX in other ways. For example, if a memory die has not experienced a soft reset or a hard reset (or any other predetermined unwanted event), the memory die may be configured to drive its dedicated IO bit to a first value (e.g., "1"). This creates a status response that satisfies predetermined status criteria that include a pattern of all is on the shared IO_BUS[7:0]. If a memory die has experienced a soft reset or a hard reset (or any other predetermined unwanted event), the memory die may be configured to drive its dedicated IO bit to a second value (e.g., "0"). This creates a status response that does not satisfy predetermined status criteria that include a pattern of all is on the shared IO_BUS [7:0].

In another example, if a memory die has not experienced a soft reset or a hard reset (or any other predetermined unwanted event), the memory die may be configured to drive its dedicated IO bit to a first value (e.g., "0"). This creates a status response that satisfies predetermined status criteria that include a pattern of all 0s on the shared IO_BUS[7:0]. If a memory die has experienced a predetermined unwanted event, such as a soft reset or a hard reset (or any other predetermined unwanted event), the memory die may be configured to ignore the CMD_XX command and not drive its dedicated IO bit (e.g., the memory die floats its dedicated IO bit). This creates a status response that does not satisfy predetermined status criteria that include a pattern of all 0s on the shared IO_BUS[7:0].

In an embodiment, the memory controller receives the status response. If the received status response satisfies predetermined status criteria, the memory controller sends one or more memory operation commands to the plurality of memory die. Memory operation commands may include read commands, write commands, and erase commands. If the received status response does not satisfy predetermined status criteria, the memory controller may send a repair command (e.g., a power on read or other command resetting one or more memory die parameters) to the plurality of memory die, or may send further status commands to further determine the nature or cause of the predetermined unwanted event.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In one embodiment, the memory cells within a memory array may include re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide.

In another embodiment, the reversible resistance-switching material may include a phase change material. The phase change material may include a chalcogenide material. In some cases, the re-writeable non-volatile memory cells may comprise ReRAM memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system also may include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 1B:
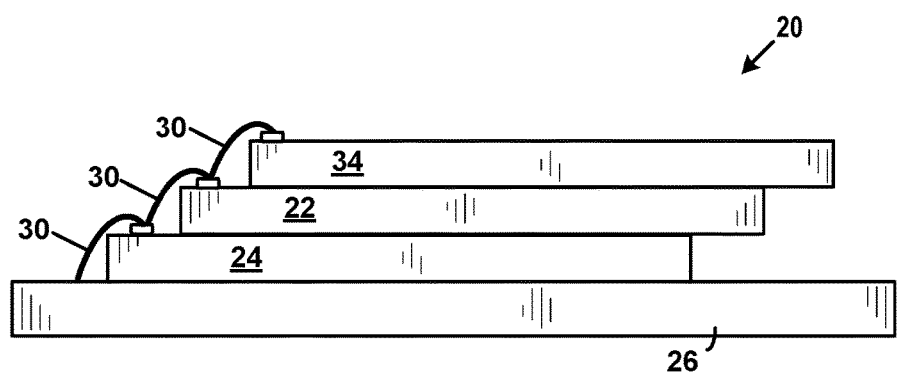
Figure 1C:
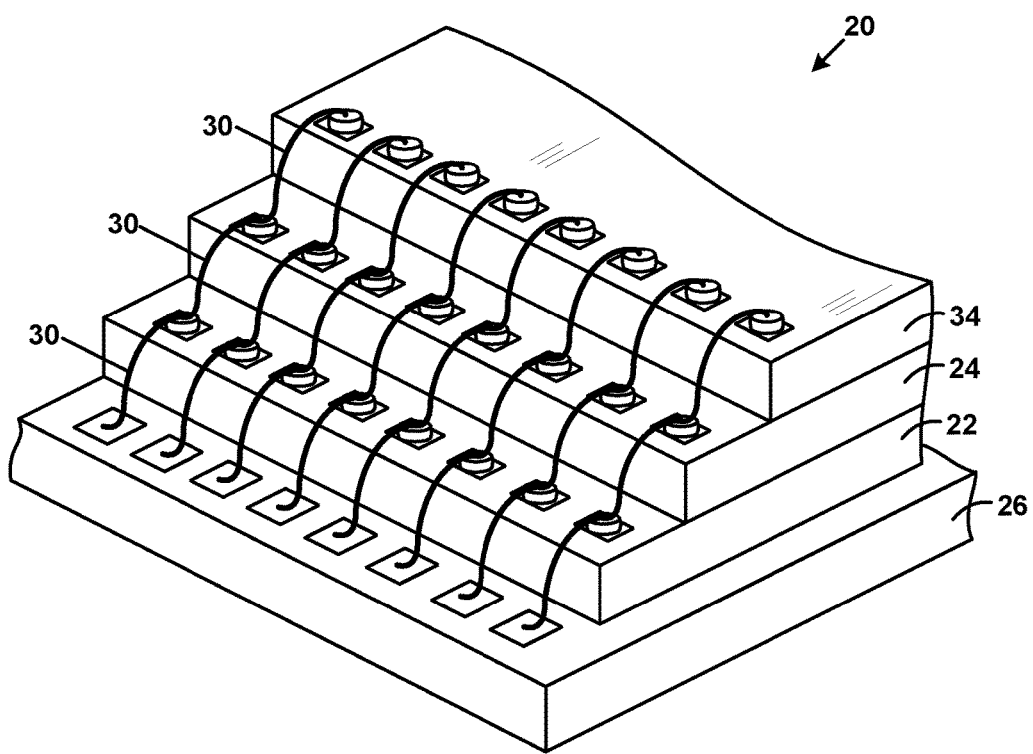

FIGS. 1A-1C depict various embodiments of a plurality of stacked die within a semiconductor package 20. As depicted, a plurality of semiconductor die, such as die 22, 24, and 34 may be mounted to a substrate 26 and encased within semiconductor package 20. In one example, each of die 22, 24, and 34 may include a semiconductor memory die. In another example, die 22 may include a flash memory die, and die 24 may include a memory controller. In some embodiments, the number of vertically stacked die within a package may include more than two die (e.g., 8 or 16 die within the package).

Each of the semiconductor die may include bond pads on an upper surface of the die for allowing electrical access to integrated circuitry within the die. Each bond pad may correspond with an input pin, an output pin, or an input/output (I/O) pin that connects to the integrated circuitry. Wire bonding connections, such as bond wires 30, may be used to electrically connect a die with other die within the package or to substrate 26. Bond wires 30 may include a metal such as copper, aluminum, or gold.

As depicted in FIG. 1A, two or more semiconductor die may be stacked directly on top of each other, thereby taking up a small footprint on substrate 26. However, in a vertically stacked configuration without through-silicon vias (TSVs), space must be provided between adjacent semiconductor die for the bond wire connections. A dielectric spacer layer 33 may be used to provide space for the bond wires 30 to be bonded to bond pads on the lower die 24. As depicted in FIGS. 1B-1C, instead of stacking die directly above each other, each of the stacked semiconductor die may be offset such that the bond pads on one side of each die are exposed.

Figure 2A:
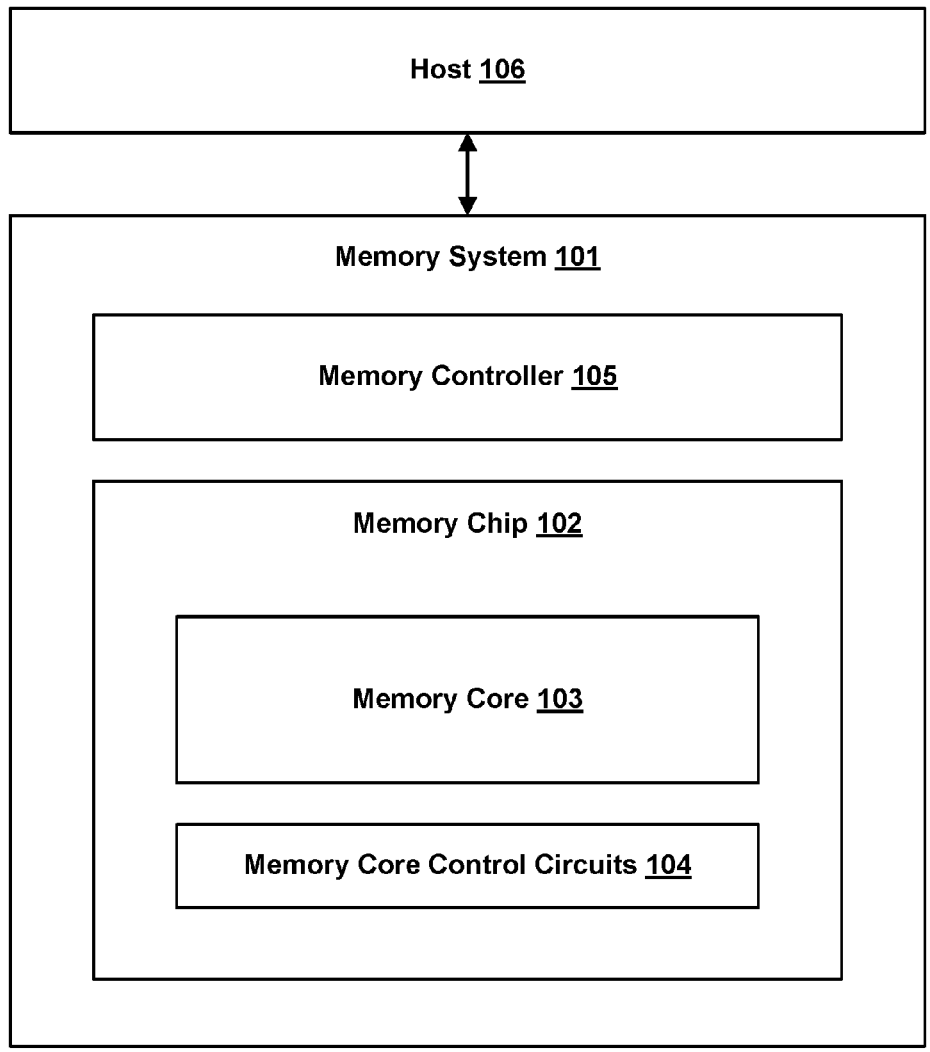
FIG. 2A depicts one embodiment of a memory system and a host.

FIG. 2A depicts one embodiment of a memory system 101 and a host 106. Host 106 may include a computing device (e.g., a personal computer, audio player, digital camera, or mobile computing device) or a storage device (e.g., an enterprise storage device). Memory system 101 may include a memory card, a flash drive, a system on a chip (SOC), or an embedded memory system. In one embodiment, memory system 101 may be embedded within a multi-chip package. As depicted, memory system 101 includes a memory controller 105 and a memory chip 102.

In some cases, a memory system, such as memory system 101, may include more than one memory chip or memory die. In one example, memory system 101 may include 16 NAND die stacked within a multi-chip package. Memory controller 105 may include one or more state machines, control logic, page registers, non-volatile memory, SRAM, or other circuitry for controlling the operation of memory chip 102.

The one or more state machines, control logic, page registers, non-volatile memory, SRAM, and/or other circuitry for controlling the operation of memory chip 102 may be referred to as managing or control circuits. The managing or control circuits may be used to facilitate one or more memory array operations associated with memory chip 102 including erasing, programming, and reading operations.

Memory controller 105 may receive data and commands from host 106 and provide memory chip data to host 106. In some embodiments, memory controller 105 and memory chip 102 may be arranged on a single integrated circuit. In other embodiments, memory controller 105 and memory chip 102 may be arranged on different integrated circuits.

As depicted, memory chip 102 includes memory core control circuits 104 and memory core 103. Memory core control circuits 104 may include logic for controlling the selection of memory blocks (or arrays) within memory core 103, controlling the generation of voltage references for biasing a particular memory array into a read or write state, and generating row and column addresses. Memory core 103 may include one or more two-dimensional arrays of memory cells or one or more three-dimensional arrays of memory cells. The memory cells may include floating-gate transistors or non-volatile memory technologies that employ charge trapping, phase-change (e.g., chalcogenide materials), or state-change materials. In one embodiment, memory core control circuits 104 and memory core 103 are arranged on a single integrated circuit. In other embodiments, memory core control circuits 104 and memory core 103 may be arranged on different integrated circuits.

Referring to FIG. 2A, a memory system operation may be initiated when host 106 sends instructions to memory controller 105 indicating that host 106 would like to read data from memory system 101 or write data to memory system 101. In the event of a write (or programming) operation, host 106 may send to memory controller 105 both a write command and the data to be written.

The data to be written may be buffered by memory controller 105 and error correcting code (ECC) data may be generated corresponding with the data to be written. The ECC data, which allows data errors that occur during transmission or storage to be detected and/or corrected, may be written to memory core 103 or stored in non-volatile memory within memory controller 105. In one embodiment, the ECC data is generated and data errors are corrected by circuitry within memory controller 105.

In some cases, the operation of memory chip 102 may be controlled by memory controller 105. In one example, before issuing a write operation to memory chip 102, memory controller 105 may check a status register to make sure that memory chip 102 is able to accept the data to be written. In another example, before issuing a read operation to memory chip 102, memory controller 105 may pre-read overhead information associated with the data to be read. The overhead information may include ECC data associated with the data to be read or a redirection pointer to a new memory location within memory chip 102 in which to read the data requested.

Once a read or write operation is initiated by memory controller 105, memory core control circuits 104 may generate the appropriate bias voltages for word lines and bit lines within memory core 103, as well as generate the appropriate memory block, row, and column addresses. Memory controller 105 may manage the translation (or mapping) of logical addresses received from host 106 into physical addresses associated with memory chip 102. The mapping tables for mapping the logical addresses corresponding with logical groups of data to physical address corresponding with memory locations within memory chip 102 may be stored within memory controller 105 or within memory chip 102.

In some embodiments, memory controller 105 may control one or more memory chips within a memory system. Each of the one or more memory chips may be organized into a plurality of memory blocks. In some cases, each of the one or more memory chips may be organized into a plurality of metablocks. A metablock may include a plurality of memory blocks. A memory block may include a group of memory cells that are erased concurrently (i.e., a unit of erase).

In some cases, the group of memory cells may include a binary cache or a group of multi-level cells for storing user data. Each of the plurality of memory blocks may include a plurality of pages. A page may include a group of memory cells that may be accessed, programmed, and/or read concurrently. The group of memory cells within a page may share a common word line. In some cases, a memory block may include 32, 64, or 128 pages and each page may include 2 KB or 4 KB of data.

Figure 2B:
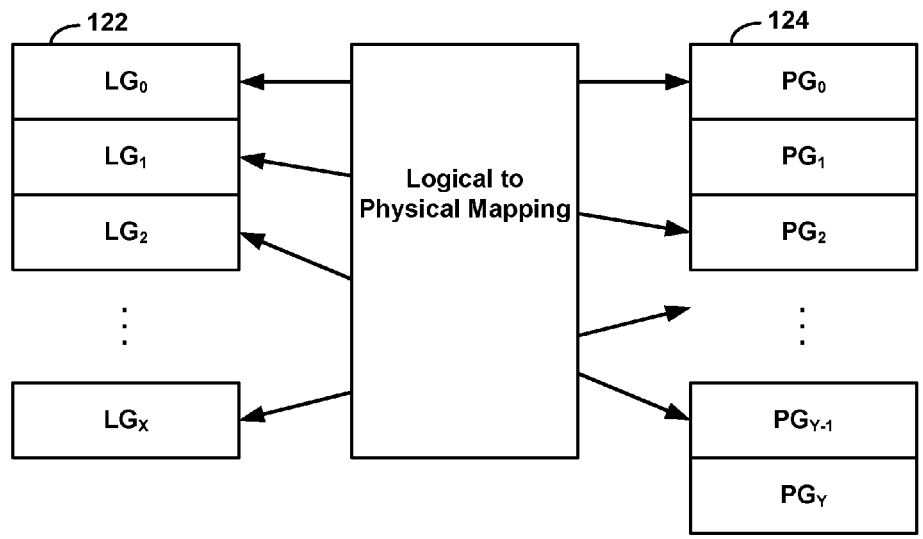
FIG. 2B depicts one embodiment of a mapping between logical groups and physical groups as performed by a memory system.

FIG. 2B depicts one embodiment of a mapping between logical groups and physical groups as performed by a memory system, such as memory system 101 in FIG. 2A. As depicted, each logical group of logical groups 122 (e.g., represented as a logical block address) is mapped to a unique physical group of physical groups 124 (e.g., represented as a memory block or page address). A logical group may be associated with a metablock, a page, or a portion of a page.

In some cases, a logical group may include a grouping of one or more logical sectors which are mapped to a metablock. The logical to physical mapping between the logical groups and the physical groups may be stored in a table or list within a non-volatile memory, such as memory core 103 in FIG. 2A. In some cases, each logical group may be mapped to a metablock address. In one embodiment, a Group Address Table (GAT) may be used to store a mapping of metablock addresses for each logical group within a memory system.

Figure 2C:
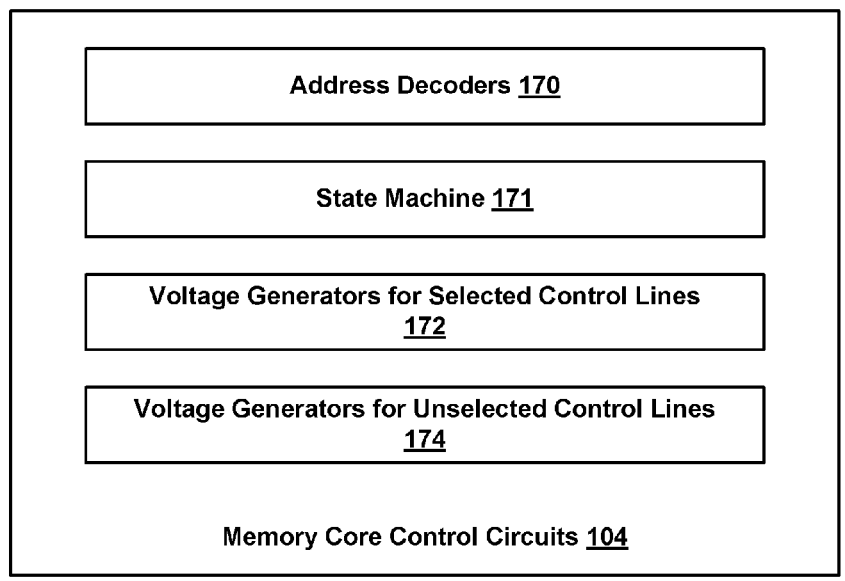
FIG. 2C depicts one embodiment of memory core control circuits.

FIG. 2C depicts one embodiment of memory core control circuits 104 in FIG. 2A. As depicted, memory core control circuits 104 include address decoders 170, state machine 171, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

The voltage generators (or voltage regulators) for selected control lines 172 may include one or more voltage generators for generating selected control line voltages. The voltage generators for unselected control lines 174 may include one or more voltage generators for generating unselected control line voltages. Address decoders 170 may generate memory block addresses, as well as row addresses and column addresses for a particular memory block or memory array.

State machine 171 may provide chip-level control of memory operations. In one example, state machine 171 may cause various voltages to be applied to control lines (e.g., selected word lines and unselected word lines) within a memory array corresponding with a particular memory operation (e.g., a read or write operation). State machine 171 may implement control logic for controlling read, write, or erase operations.

Figure 2D:
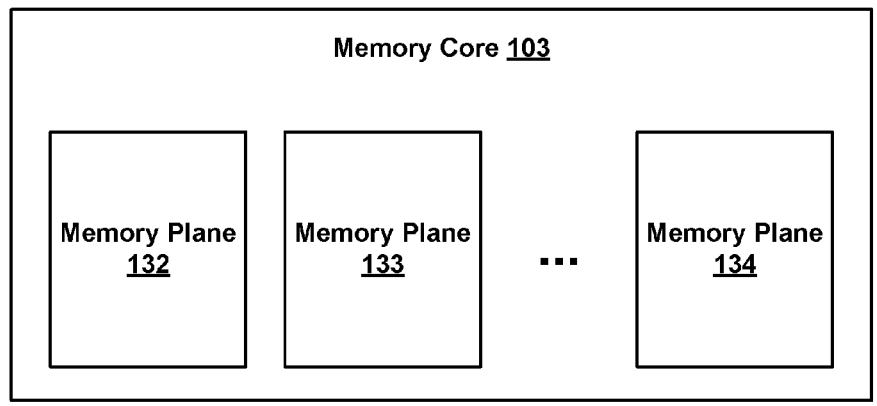
FIG. 2D depicts one embodiment of a memory core.

FIG. 2D depicts one embodiment of memory core 103 in FIG. 2A. As depicted, memory core 103 includes memory planes 132-134. In some embodiments, the number of memory planes (or bays) per memory core can be different for different implementations. For example, a memory core may include only a single memory plane or a plurality of memory planes (e.g., 16 memory planes). Each memory plane may include one or more memory blocks. Each memory block may include one or more memory cells. In some cases, multiple memory planes may be operated in parallel to increase read and/or write bandwidth. Although a memory core organization is depicted where memory planes include memory blocks, and memory blocks include a group of memory cells, other organizations or groupings can also be used with the technology described herein.

Figure 2E:
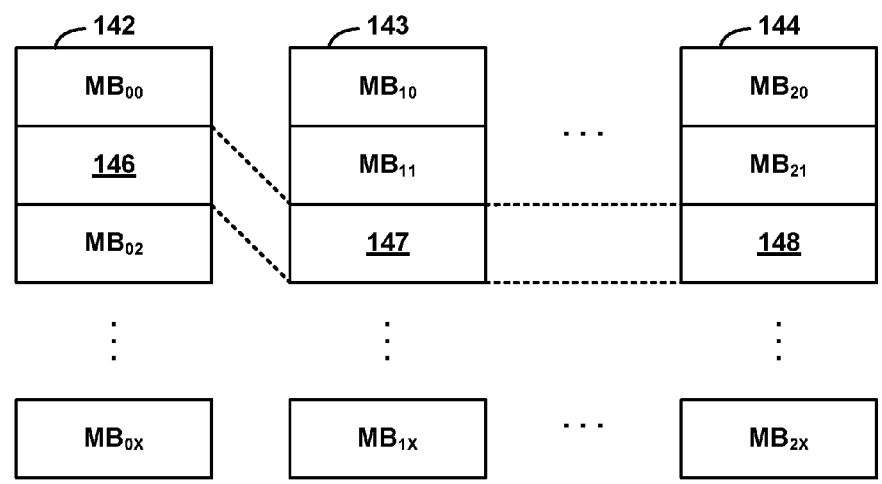
FIG. 2E depicts one embodiment of a memory core organization including a plurality of memory planes.

FIG. 2E depicts one embodiment of a memory core organization including a plurality of memory planes. Memory planes 142-144 each include a plurality of physical groups. Each physical group may include a memory block (e.g., memory block $MB_{00}$). In some cases, memory blocks across the plurality of physical groups may be linked together to form a metablock. For example, memory blocks 146-148 may be linked together to form a metablock. As depicted, the memory blocks used to form a metablock may be from various locations within their respective memory planes.

For example, memory block 146 from memory plane 142, memory block 147 from memory plane 143, and memory block 148 from memory plane 144 may be linked together to form a metablock or a portion of a metablock. As each of the memory blocks may include a plurality of pages, a metapage extending across each of the memory planes 142-144 may be created by linking pages from each of the memory blocks within a metablock together. In some embodiments, a subset of the memory blocks within a memory plane may correspond with one or more spare blocks.

Figure 3:
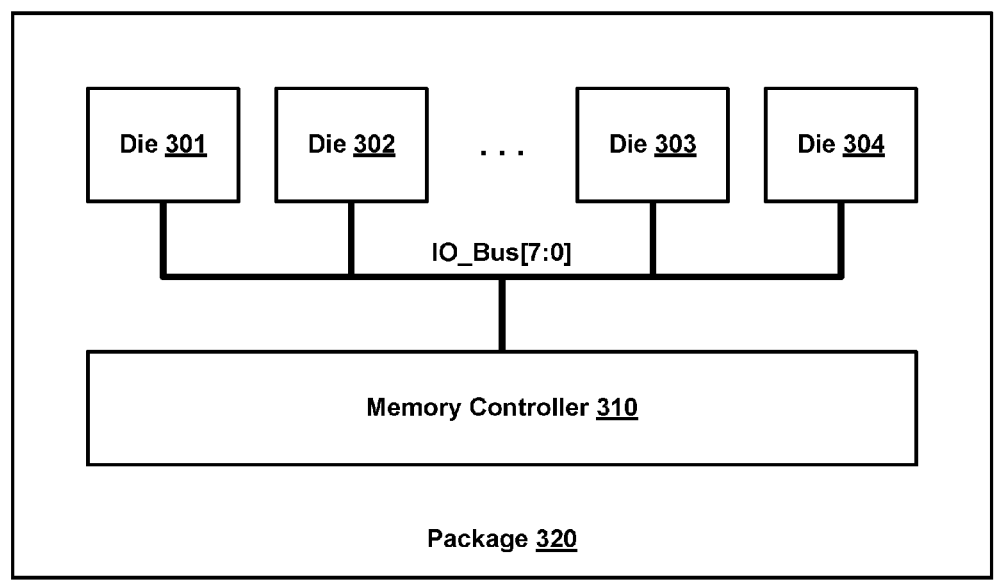
FIG. 3 depicts one embodiment of a portion of a memory system.

FIG. 3 depicts one embodiment of a portion of a system, such as memory system 101 in FIG. 2A, included within a package 320. The portion of the system includes memory die 301-304 and memory controller 310 connected to memory die 301-304 via a shared 8-bit I/O bus IO_Bus[7:0]. Although only four memory die are depicted in FIG. 3, memory controller 310 may be connected to or in communication with more than or less than four memory die via a shared I/O bus.

In some cases, memory die 301-304 may be vertically stacked within package 320 or arranged in a horizontal manner within package 320. In some cases, package 320 may include a BGA package, a TSOP package, or other type of package. As depicted, memory controller 310 may include a memory controller, such as memory controller 105 in FIG. 2A, and may broadcast various status commands and receive data via the shared I/O bus. Memory die 301-304 may include NAND Flash memory die, ReRAM memory die, or other type of memory die. In one embodiment, the set of one or more of bits that is driven by each memory die during a status information cycle may be determined via a CADD address that is specific to each memory die.

FIG. 4 depicts one embodiment of a chart describing various system configurations. System configuration 410 includes an eight memory die configuration with a single chip enable signal CE0 for each of the eight memory die. In this case, memory die "DIE-0" is assigned a CADD address "000" corresponding with driving bit position "0" of a shared I/O bus and memory die "DIE-4" is assigned a CADD address "100" corresponding with driving bit bit position "4" of the shared I/O bus.

Example system configuration 412 includes an eight memory die configuration with two chip enable signals CE0 and CE1, in which CE0 is connected to memory die associated with DIE-0 through DIE-3 and CE1 is connected to memory die associated with DIE-4 through DIE-7. In this case, memory die "DIE-1" is assigned a CADD address "001" corresponding with driving bit position "1" of a shared I/O bus and memory die "DIE-7" is assigned a CADD address "111" corresponding with driving bit position "7" of the shared I/O bus. A chip enable signal may be used to enable or disable a set of one or more memory die.

Figure 5:
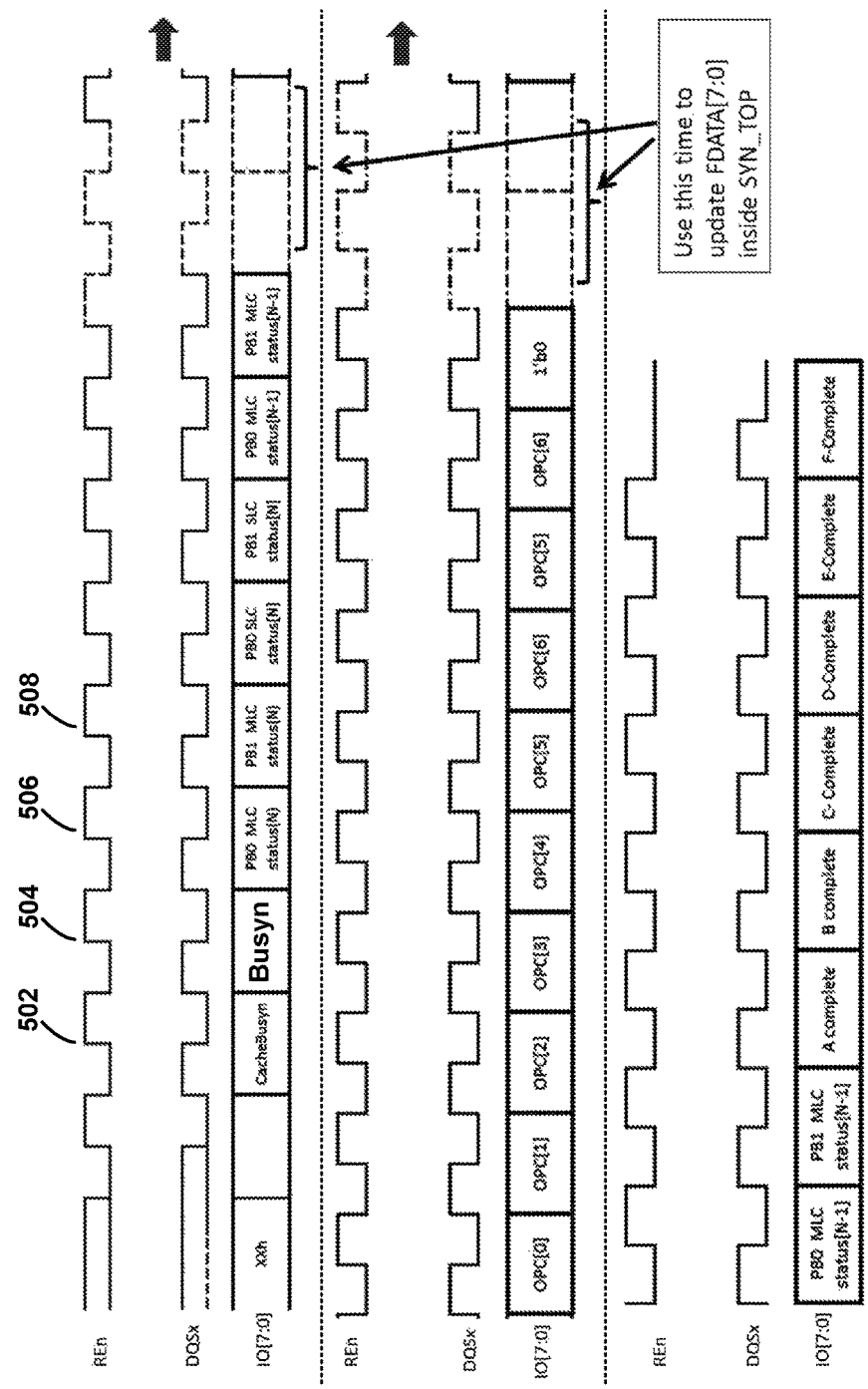
FIG. 5 depicts one embodiment of signal waveforms associated with a memory controller broadcasting a status command and in response concurrently receiving one or more sets of status information from each memory die of a plurality of memory die.

FIG. 5 depicts one embodiment of signal waveforms associated with a memory controller broadcasting a status command and in response concurrently receiving one or more sets of status information from each memory die of a plurality of memory die. As depicted, in response to receiving a particular status command on a shared I/O bus, the plurality of memory die drive CacheBusyn status information during a first status information cycle associated with a rising edge 502 of REn, Busyn status information during a second status information cycle associated with a rising edge 504 of REn, MLC plane 0 status information during a third status information cycle associated with a rising edge 506 of REn, and MLC plane 1 status information during a fourth status information cycle associated with a rising edge 508 of REn. Subsequent status information cycles may include loop count information (e.g., OPC[0] through OPC[6]) and programming state status information (e.g., A-complete through F-complete).

Figure 6A:
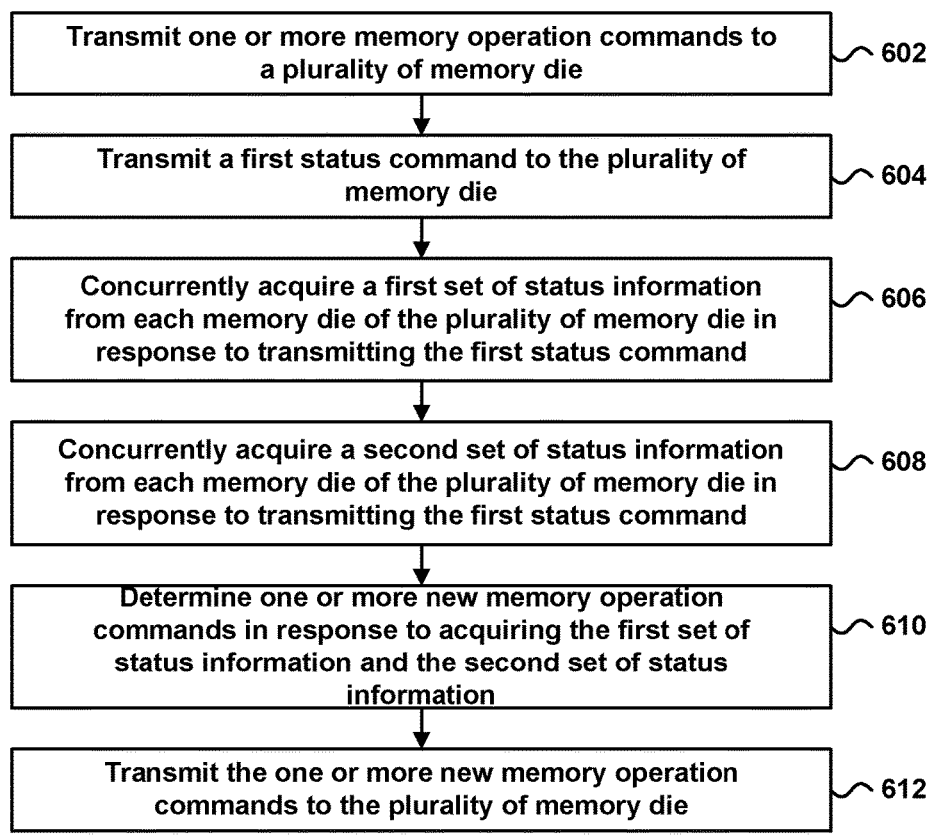
FIG. 6A is a flowchart describing one embodiment of a process for concurrently acquiring one or more sets of status information from each memory die of a plurality of memory die.

FIG. 6A is a flowchart describing one embodiment of a process for concurrently acquiring one or more sets of status information from each memory die of a plurality of memory die. In one embodiment, the process of FIG. 6A may be performed by a non-volatile storage system, such as memory system 101 in FIG. 2A.

In step 602, one or more memory operation commands are transmitted to a plurality of memory die. In one embodiment, the one or more memory operation commands may include read commands or programming commands transmitted from a memory controller to the plurality of memory die via a shared I/O bus. In one example, the memory controller may direct a first memory die of the plurality of memory die to perform a read operation and direct a second memory die of the plurality of memory die to perform a programming operation. In step 604, a first status command is transmitted to the plurality of memory die. In one embodiment, the first status command may be broadcast by the memory controller over the shared I/O bus and direct each memory die of the plurality of memory die to transmit one or more sets of status information using the shared I/O bus.

In step 606, a first set of status information is concurrently acquired from each memory die of the plurality of memory die in response to transmitting the first status command. In one example, a first memory die of the plurality of memory die may drive a first bit of the shared I/O bus and a second memory die of the plurality of memory die may drive a second bit of the shared I/O bus during a status information cycle.

In step 608, a second set of status information is concurrently acquired from each memory die of the plurality of memory die in response to transmitting the first status command. In one example, the first memory die of the plurality of memory die may drive the first bit of the shared I/O bus and the second memory die of the plurality of memory die may drive the second bit of the shared I/O bus during a second status information cycle subsequent to the status information cycle. The first set of status information may correspond with ready/busy status information and the second set of status information may correspond with loop count information. The loop count information may include either programming loop count information or erase loop count information depending on the memory operation performed by a particular memory die.

In step 610, one or more new memory operation commands are determined in response to acquiring the first set of status information and the second set of status information. In this case, the memory controller may schedule or order different memory operation commands depending on the status of each memory die of the plurality of memory die. In step 612, the one or more new memory operation commands are transmitted to the plurality of memory die.

In some cases, the memory controller may toggle out different status information (e.g., read/busy status and loop count information) using REn toggles over a plurality of status information cycles from a set of memory die. Each of the set of memory die may be connected to the same chip enable signal CEn. This allows the memory controller to obtain, for example, ready/busy information concurrently for each memory die of the set of memory die in response to a single status command.

Figure 6B:
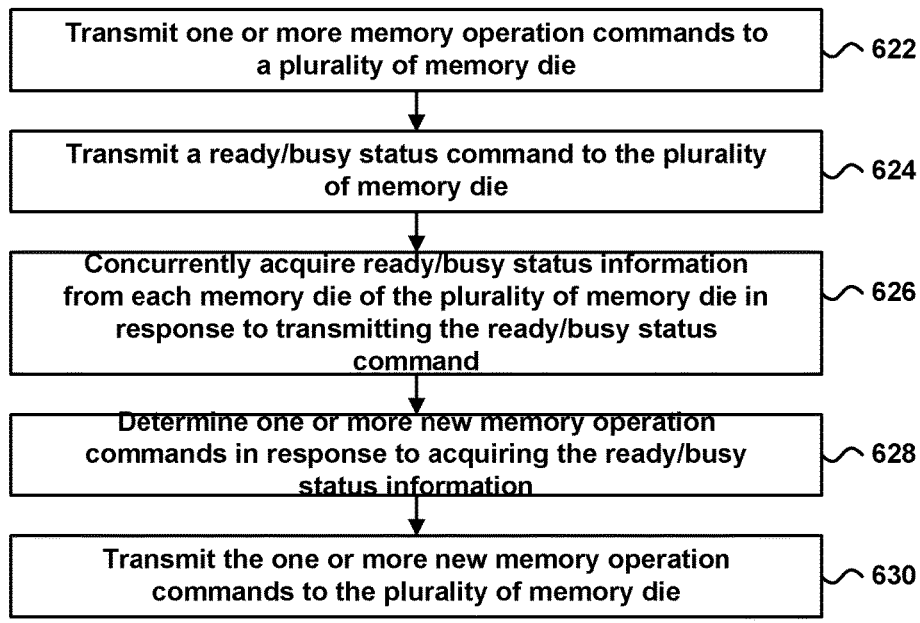
FIG. 6B is a flowchart describing another embodiment of a process for concurrently acquiring one or more sets of status information from each memory die of a plurality of memory die.

FIG. 6B is a flowchart describing another embodiment of a process for concurrently acquiring one or more sets of status information from each memory die of a plurality of memory die. In one embodiment, the process of FIG. 6B may be performed by a non-volatile storage system, such as memory system 101 in FIG. 2A.

In step 622, one or more memory operation commands are transmitted to a plurality of memory die. The plurality of memory die may include eight memory die. The memory die may include NAND Flash memory die. In one embodiment, the one or more memory operation commands may include read commands or programming commands transmitted from a memory controller to the plurality of memory die via a shared I/O bus. In one example, the memory controller may direct a first memory die of the plurality of memory die to perform a read operation and direct a second memory die of the plurality of memory die to perform a programming operation.

In step 624, a ready/busy status command is transmitted to the plurality of memory die. In step 626, ready/busy status information is concurrently acquired from each memory die of the plurality of memory die in response to transmitting the ready/busy status command. In step 628, one or more new memory operation commands are determined in response to acquiring the ready/busy status information. In this case, the memory controller may schedule or order different memory operation commands depending on the ready/busy status of each memory die of the plurality of memory die. In step 630, the one or more new memory operation commands are transmitted to the plurality of memory die.

Figure 6C:
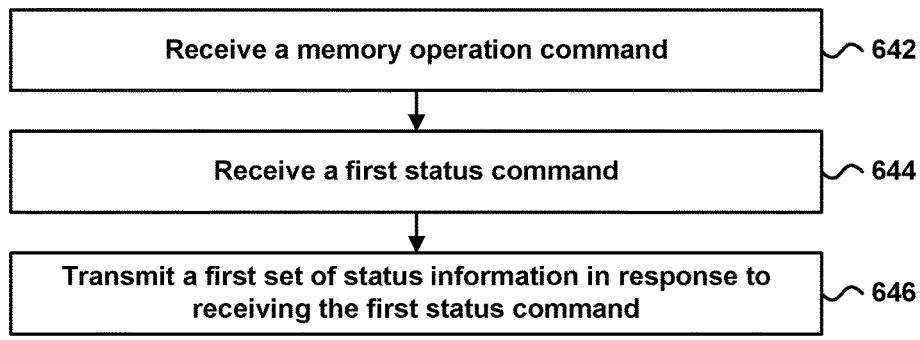
FIG. 6C is a flowchart describing one embodiment of a process for transmitting one or more sets of status information from a memory die.

FIG. 6C is a flowchart describing one embodiment of a process for transmitting one or more sets of status information from a memory die. In one embodiment, the process of FIG. 6C may be performed by a non-volatile storage system, such as memory system 101 in FIG. 2A.

In step 642, a memory operation command is received. The memory operation command may include a read operation or a programming operation. The memory operation command may be received by a memory die from a memory controller. In step 644, a first status command is received. The first status command may be broadcast from the memory controller and direct the memory die to provide status information during one or more status information cycles.

In step 646, a first set of status information is transmitted in response to receiving the first status command. The first set of status information may be provided to the memory controller using one or more bits of a shared I/O bus. The one or more bits may be determined via a CADD address that specifies which subset of bits of the shared I/O bus may be driven by the memory die. The first set of status information may include status information associated with the memory operation being performed by the memory die.

Figure 7A:
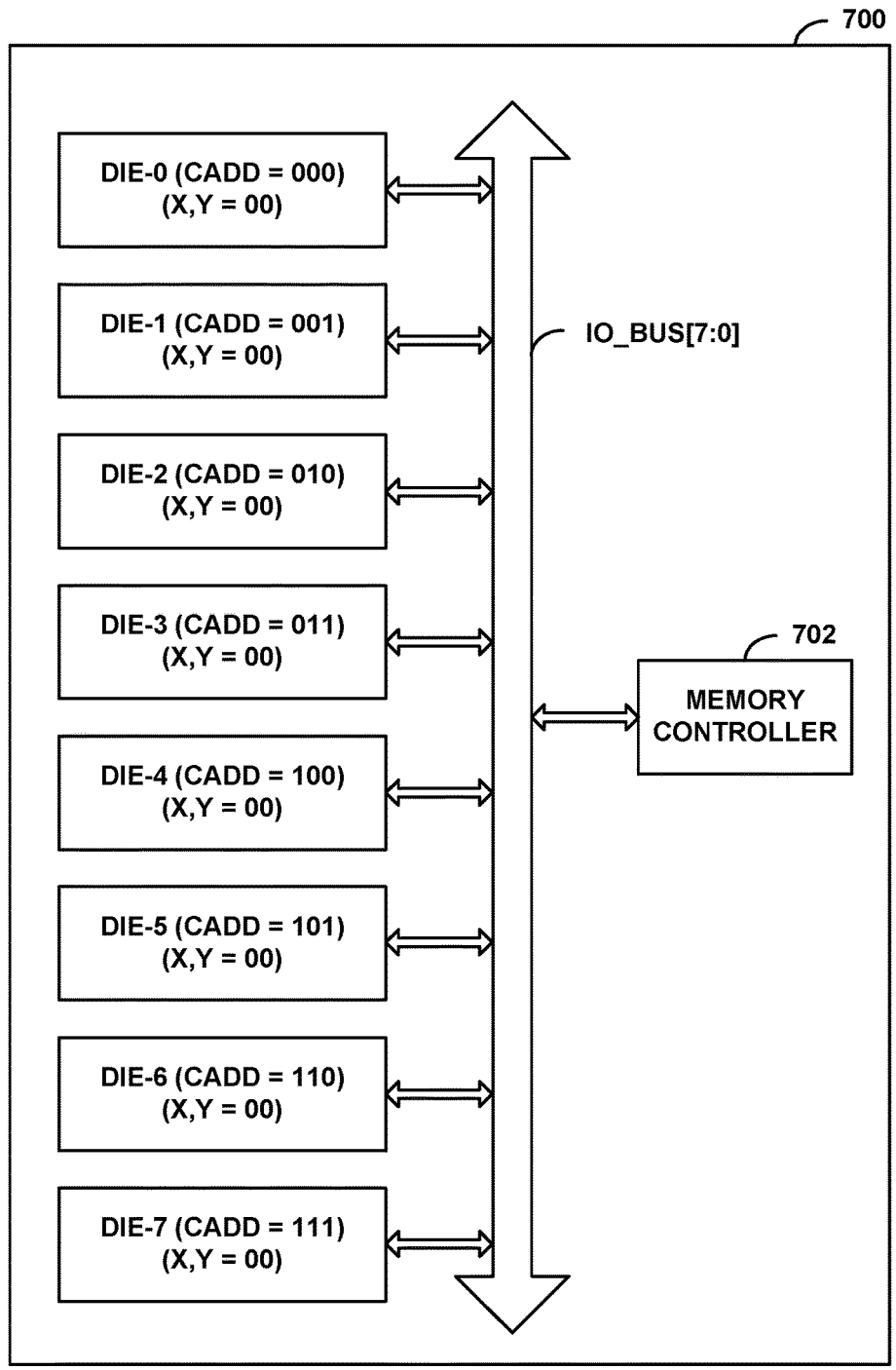
FIG. 7A depicts an embodiment of a portion of a memory system.

FIG. 7A depicts an embodiment of a portion of a system, such as memory system 101 in FIG. 2A, included within a package 700. The portion of the system includes memory die DIE-0, DIE-1, . . . , DIE-7 and a memory controller 702 connected to memory die DIE-0, DIE-1, . . . , DIE-7 via a shared 8-bit I/O bus IO_BUS[7:0]. Although eight memory die are depicted in FIG. 7A, memory controller 702 may be connected to or in communication with more than or less than eight memory die via a shared I/O bus.

In some cases, memory die DIE-0, DIE-1, . . . , DIE-7 may be vertically stacked within package 700 or arranged in a horizontal manner within package 700. In some cases, package 700 may include a BGA package, a TSOP package, or other type of package. As depicted, memory controller 702 may include a memory controller, such as memory controller 105 in FIG. 2A, and may broadcast various status commands and receive data via the shared IO_BUS[7:0]. Memory die DIE-0, DIE-1, . . . , DIE-7 may include NAND Flash memory die, ReRAM memory die, or other type of memory die.

Each of memory die DIE-0, DIE-1, . . . , DIE-7 includes a CADD address, and configuration parameters (e.g., configuration parameters X,Y). The CADD address specifies the address of the memory die within package 700, and also specifies a dedicated I/O bit within the shared IO_Bus[7:0] that the memory die drives in response to commands from memory controller 702. FIG. 7B illustrates example CADD and dedicated bit position values for memory die DIE-0, DIE-1, . . . , DIE-7. In this example, DIE-0 has a CADD address "000" corresponding with driving dedicated bit "IO0" (bit position "0") of the shared IO_Bus[7:0], DIE-1 has a CADD address "001" corresponding with driving dedicated bit "IO1" (bit position "1") of the shared IO_Bus [7:0], and so on.

Configuration parameters X,Y indicate the number of memory die that are connected to the shared IO_Bus[7:0]. FIG. 7C illustrates example values of configuration parameters X,Y for 8, 4 and 2 memory die per package, with all memory die coupled to the same chip enable (CE). In this example, configuration parameters X,Y=00 indicates that there are 8 die per package, and so on.

The combination of CADD address and configuration parameters X,Y=00 informs the die of its unique position within the multiple die package. For example, if a memory die has CADD=100 and configuration parameters X,Y=00, the memory die knows that the die is die number 4 in a package of 8 die. Alternatively, if CADD=100 and configuration parameters X,Y=01, the memory die knows that the die is in a package of 4 die, and ignores the most significant bit of the CADD address. Therefore, the memory die knows that the die is die number 0 in a package of 4 die.

Thus, referring again to FIG. 7A, each of memory die DIE-0 through DIE-7 have CADD addresses "000" through "111," respectively, and each has configuration parameters X,Y=00, indicating an 8-die package.

Configuration parameters X,Y may be altered as a result of some operating conditions, and as a result, the memory die in the package may no longer know their position in the package. For example, if a memory die experiences a power drop (e.g., a local power drop affecting only that die in a package, or a system power drop affecting more than one die in the package), configuration parameters X,Y may be altered depending on the magnitude of the power drop.

Power drops are sometimes classified as a "soft reset" or a "hard reset," with a hard reset corresponding to a greater power supply drop. For example, if a power supply has a minimum specified voltage of 3.3V, a soft reset (SR) and a hard reset (HR) may be defined as follows:

$$3.3V > SR \geq 2.3V$$

$$HR < 2.3V$$

In an embodiment, if a memory die experiences a hard reset, configuration parameters X,Y may be reset to 11, whereas if a memory die experiences a soft reset, configuration parameters X,Y are not reset.

Figure 7D:
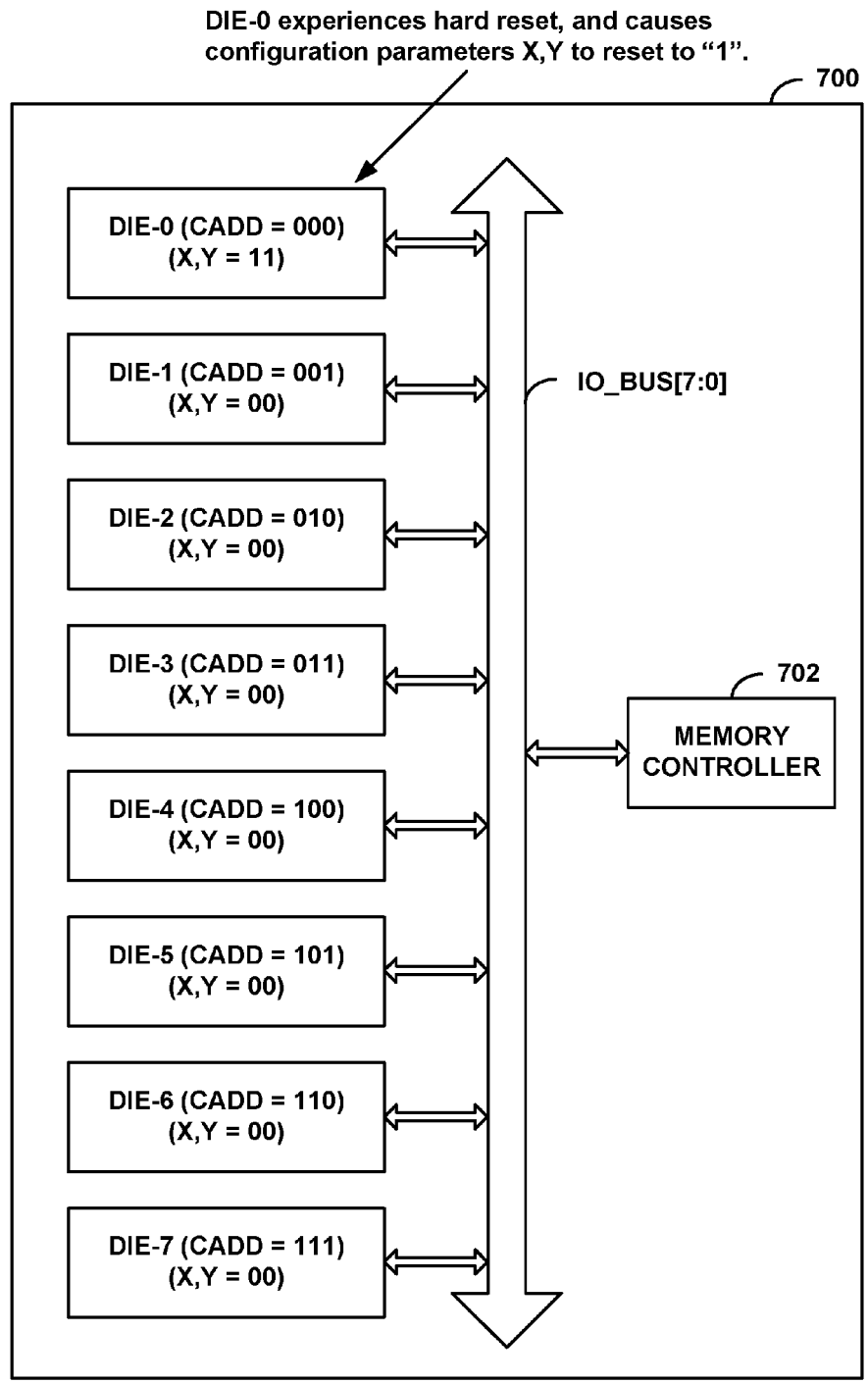
FIG. 7D depicts another embodiment of a portion of a memory system.

FIG. 7D depicts memory die DIE-0, DIE-1, . . . , DIE-7 of package 700 following a hard reset on memory die DIE-0. As a result of the hard reset, configuration parameters X,Y of memory die DIE-0 are reset to 11. As a consequence, memory die DIE-0 no longer knows its position within the multiple die package, and thinks that memory die DIE-0 is the only die in the package. As memory controller 702 sends commands over IO_BUS[7:0] to memory die DIE-0, DIE-1, . . . , DIE-7, memory die DIE-0 interprets all commands (even those addressed to other memory die) as being directed to memory die DIE-0, and responds to all commands (including commands addressed to other memory die). If more than one memory die experiences a hard reset, configuration parameters X,Y are reset on each of the hard reset memory die, and each of those memory die no longer knows its position within the multiple die package.

Memory die, such as memory die DIE-0, DIE-1, . . . , DIE-7, include the ability to detect soft reset and hard reset events, and to report this information to a memory controller, such as memory controller 702, in response to a particular status command (e.g., CMD_HS) from the memory controller. For example, memory controller 702 broadcasts CMD_HS via IO_BUS[7:0] to memory die DIE-0, DIE-1, . . . , DIE-7, and the selected memory die drives IO_BUS[7:0] with status regarding soft reset and hard reset events.

However, if a memory die experiences a hard reset, configuration parameters X,Y are reset, the memory die no longer knows its position within the multiple die package, and the memory die cannot uniquely respond to CMD_HS commands. As a result, multiple die respond to the CMD_HS command, and the memory controller cannot uniquely determine if any of the memory die experienced a hard reset.

Technology is described for determining memory die status information following predetermined unwanted events (e.g., soft power resets, hard power resets, power drop suspends, power on read failures, word line shorts, etc.) that may cause one or more memory die in a multi-die package to no longer function properly. In an embodiment, a memory controller sends a status command (e.g., CMD_XX) to all memory die in a package that are connected to the same CE. For example, memory controller 702 sends status command CMD_XX via IO_BUS[7:0] to memory die DIE-0, DIE-1, . . . , DIE-7. In response to receiving status command CMD_XX, each of the memory die are configured to selectively drive their dedicated IO bit depending on whether the memory die experienced a predetermined unwanted event (e.g., a soft reset or a hard reset).

In an embodiment, if a memory die has not experienced a predetermined unwanted event (e.g., a soft reset or a hard reset), the memory die drives its dedicated IO bit with the value of the least significant bit of the CADD address of the memory die. This creates a status response that satisfies predetermined status criteria that includes a pattern of alternating 1s and 0s on the shared IO_BUS[7:0]. Memory controller 702 receives the predetermined status response concurrently from memory die DIE-0, DIE-1, . . . , DIE-7 based on status command CMD_XX.

If a memory die has experienced a predetermined unwanted event, such as a soft reset or a hard reset (or any other predetermined unwanted event), the memory die is configured to ignore the CMD_XX command and not drive its dedicated IO bit (e.g., the memory die floats its dedicated IO bit). This creates a status response that does not satisfy predetermined status criteria of a pattern of alternating 1s and 0s on the shared IO_BUS[7:0]. Memory controller 702 receives the status response concurrently from memory die DIE-0, DIE-1, . . . , DIE-7 based on status command CMD_XX.

For an additional degree of certainty, memory controller 702 may send two status commands to memory die DIE-0, DIE-1, . . . , DIE-7 to determine if any of the memory dieexperienced a predetermined unwanted event (e.g., a soft reset or a hard reset). In an embodiment, memory controller 702 sends a first status command CMD_XX (e.g., CMD_XX1) via IO BUS[7:0] to memory die DIE-0, DIE-1, . . . ,DIE-7, and receives a first status response concurrently from memory die DIE-0, DIE-1, . . . , DIE-7 based on first status command CMD_XX1, and then sends a second status command CMD XX (e.g., CMD_XX2) via IO BUS[7:0] to memory die DIE-0, DIE-1, . . . ,DIE-7, and receives a second status response concurrently from memory die DIE-0, DIE-1, . . . ,DIE-7 based on second status command CMD_XX2.

In an embodiment, if a memory die has not experienced a predetermined unwanted event (e.g., a soft reset or a hard reset), in response to first status command CMD_XX1, each memory die drives its dedicated IO bit with the value of the least significant bit of the CADD address of the memory die. This creates a first status response that satisfies first predetermined status criteria of a pattern of alternating 1s and 0s on the shared IO_BUS[7:0]. In response to second status command CMD_XX2, each memory die drives its dedicated IO bit with the inverse of the value of the least significant bit of the CADD address of the memory die. This creates a second status response that satisfies second predetermined status criteria of alternating 1s and 0s on the shared IO_BUS[7:0].

Figure 8:
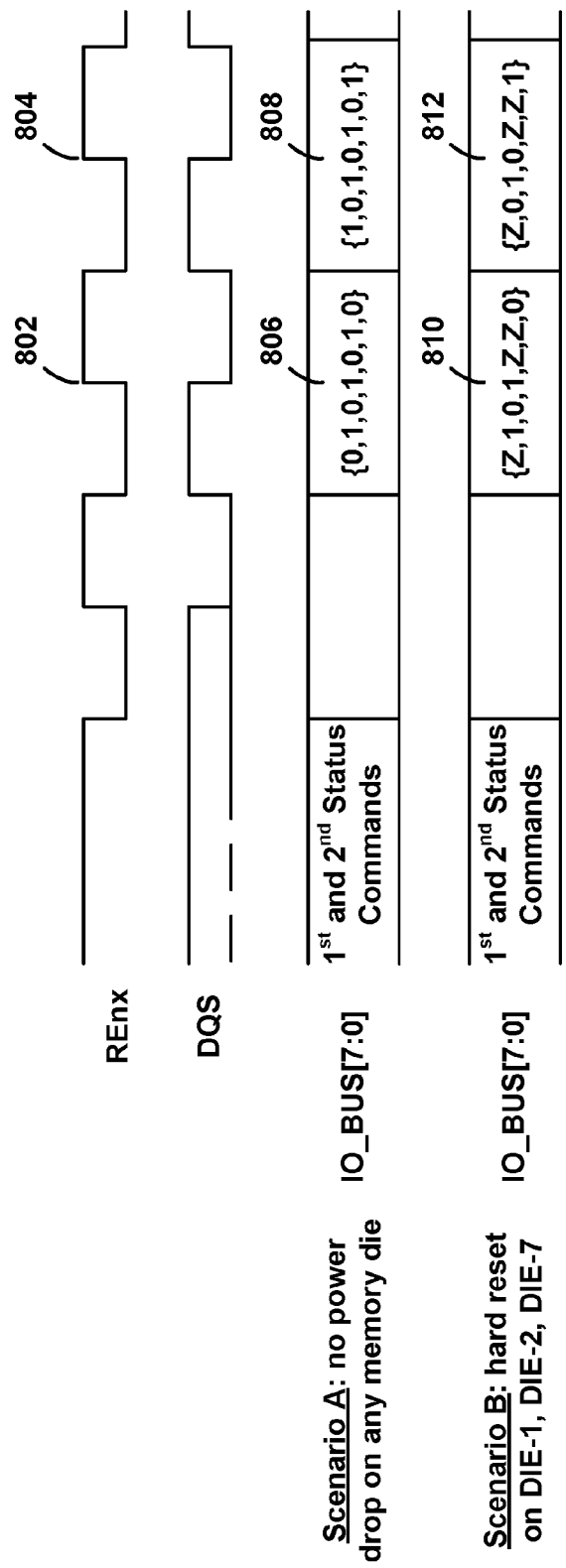
FIG. 8 depicts an embodiment of signal waveforms associated with a memory controller broadcasting a status command and in response concurrently receiving status information from each memory die of a plurality of memory die.

FIG. 8 depicts example signal waveforms associated with a memory controller broadcasting two status commands and in response concurrently receiving status information from each memory die of a plurality of memory die. As depicted, in response to receiving first and second status commands CMD_XX (e.g., CMD_XX1 and CMD_XX2) on a shared I/O bus, the plurality of memory die drive first status response during a first status information cycle associated with a rising edge 802 of REn, and second status response during a second status information cycle associated with a rising edge 804 of REn.

FIG. 8 depicts example signal waveforms for two scenarios: Scenario A, in which no memory DIE-0, . . . , DIE-7 experience a predetermined unwanted event (e.g., a soft reset or a hard reset), and Scenario B, in which memory DIE-1, DIE-2 and DIE-7 each experience a predetermined unwanted event (e.g., a soft reset or a hard reset). In Scenario A, a first status response 806 includes a first status response that satisfies first predetermined status criteria of a pattern of alternating 1s and 0s on the shared IO_BUS[7:0], and a second status response 808 includes a second status response that satisfies second predetermined status criteria of an inverted pattern of alternating 1s and 0s on the shared IO_BUS[7:0]. In Scenario B, a first status response 810 does not satisfy first predetermined status criteria of pattern of alternating 1s and 0s on the shared IO_BUS[7:0], and a second status response 812 does not satisfy second predetermined status criteria of an inverted pattern of alternating 1s and 0s on the shared IO_BUS[7:0]. In particular, in first status response 810 and second status response 812 bit positions 1, 2 and 7 are not driven (e.g., floating).

Figure 9A:
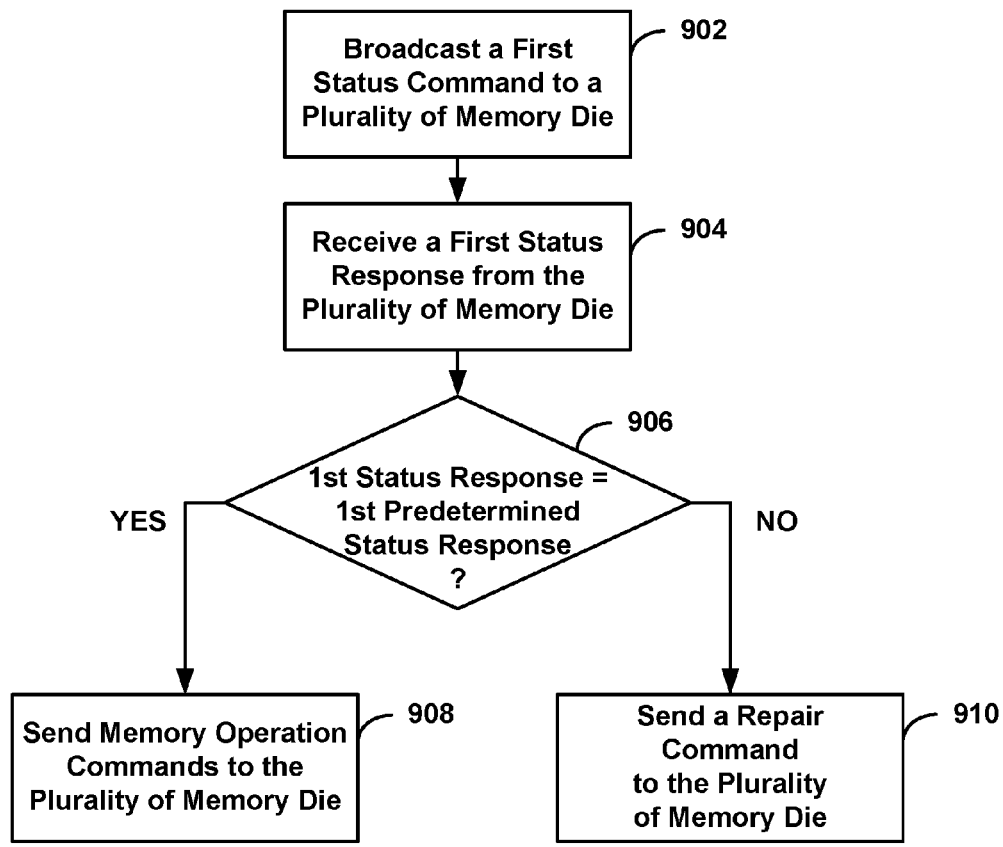
FIG. 9A is a flowchart describing an embodiment of a process for concurrently acquiring status information from each memory die of a plurality of memory die.

FIG. 9A is a flowchart describing an embodiment of a process for concurrently acquiring status information from each memory die of a plurality of memory die using a status command. In an embodiment, the process of FIG. 9A may be performed by a non-volatile storage system, such as memory system 101 in FIG. 2A.

In step 902, a first status command is transmitted to the plurality of memory die. In one embodiment, the first status command may be broadcast by a memory controller (e.g., memory controller 702 of FIG. 7A) over the shared I/O bus (e.g., IO_BUS[7:0} of FIG. 7A) to a plurality of memory die (e.g., DIE-0, . . . , DIE-7 of FIG. 7A) and direct each memory die of the plurality of memory die to transmit status information using the shared I/O bus.

In step 904, a first status response is concurrently received from each memory die of the plurality of memory die in response to transmitting the first status command. In one example, a first memory die of the plurality of memory die may drive a first bit of the shared I/O bus, a second memory die of the plurality of memory die may drive a second bit of the shared I/O bus, and so on during a status information cycle, forming a first status response that is received by memory controller 702.

In step 906, a determination is made whether the first status response satisfies first predetermined status criteria. For example, memory controller 702 may compare the first status response to a pattern of alternating 1s and 0s on the shared IO_BUS[7:0]. If the first status response satisfies first predetermined status criteria, at step 908 one or more memory operation commands are transmitted to the plurality of memory die. For example, memory controller 702 may transmit on the shared IO_BUS[7:0] one or more memory operation commands (e.g., read, write, erase) to the plurality of memory die.

If, however, the first status response does not satisfy first predetermined status criteria (e.g., one or more bits of the first status response are floating), at step 910, a repair command is sent to the plurality of memory die. In an embodiment, memory controller 702 sends a repair command (e.g., a power on read or other command resetting one or more memory die parameters) to each of the plurality of memory die. In another embodiment, at step 910 memory controller 702 identifies which dedicated IO bit(s) were not driven (e.g., floating), and sends a repair command (e.g., a power on read or other command resetting one or more memory die parameters) only to the identified memory die that did not respond to the first status command.

Figure 9B:
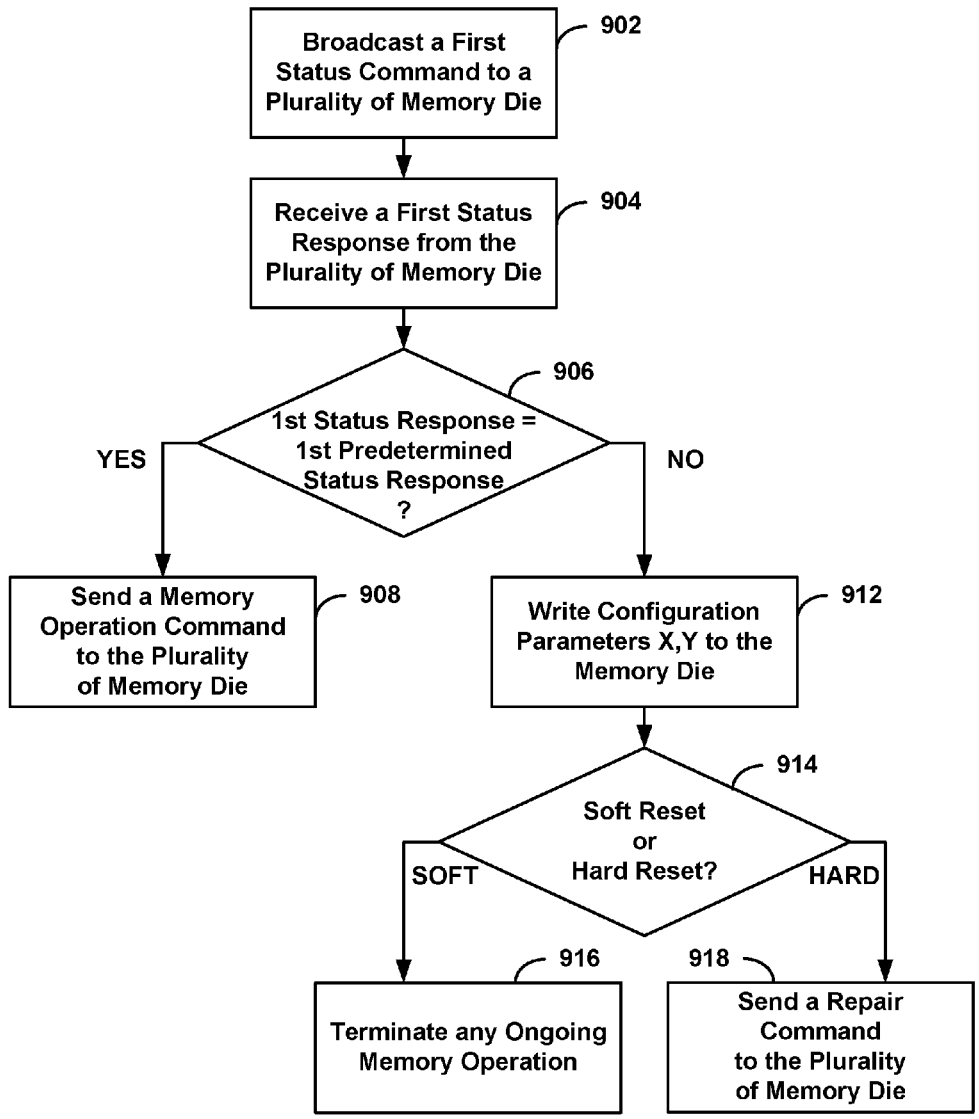
FIG. 9B is a flowchart describing another embodiment of a process for concurrently acquiring status information from each memory die of a plurality of memory die.

FIG. 9B is a flowchart describing another embodiment of a process for concurrently acquiring status information from each memory die of a plurality of memory die using a status command. In an embodiment, the process of FIG. 9B may be performed by a non-volatile storage system, such as memory system 101 in FIG. 2A.

In step 902, a first status command is transmitted to the plurality of memory die. In one embodiment, the first status command may be broadcast by a memory controller (e.g., memory controller 702 of FIG. 7A) over the shared I/O bus (e.g., IO_BUS[7:0} of FIG. 7A) to a plurality of memory die (e.g., DIE-0, . . . , DIE-7 of FIG. 7A) and direct each memory die of the plurality of memory die to transmit status information using the shared I/O bus.

In step 904, a first status response is concurrently received from each memory die of the plurality of memory die in response to transmitting the first status command. In one example, a first memory die of the plurality of memory die may drive a first bit of the shared I/O bus, a second memory die of the plurality of memory die may drive a second bit of the shared I/O bus, and so on during a status information cycle, forming a first status response that is received by memory controller 702.

In step 906, a determination is made whether the first status response satisfies first predetermined status criteria. For example, memory controller 702 may compare the first status response to a pattern of alternating 1s and 0s on the shared IO_BUS[7:0]. If the first status response satisfies first predetermined status criteria, at step 908 one or more memory operation commands are transmitted to the plurality of memory die. For example, memory controller 702 may transmit on the shared IO_BUS[7:0] one or more memory operation commands (e.g., read, write, erase) to the plurality of memory die.

If, however, the first status response does not satisfy first predetermined status criteria (e.g., one or more bits of the first status response are floating), at step 912, configuration parameters X,Y are written to the memory die. For example, memory controller 702 may write configuration parameters X,Y to each of the plurality of memory die. In another embodiment, at step 912 memory controller 702 identifies which dedicated IO bit(s) were not driven (e.g., floating), and writes configuration parameters X,Y only to the identified memory die that did not respond to the first status command.

At step 914, for each of the identified non-responding memory die a determination is made whether the memory die experienced a predetermined unwanted event (e.g., a soft reset or a hard reset). For example, memory controller 702 may send status command CMD_HS to each of the identified memory die that did not respond to the first status command, and in response, the identified memory die respond indicating whether they experienced a soft reset or a hard reset.

At step 916, a terminate operation command is sent to any memory die that experienced a soft reset. Because an ongoing memory operation may not have completed correctly prior to the soft reset, the ongoing memory operation is terminated.

At step 918, a repair command is sent to any memory die that experienced a hard reset. In an embodiment, memory controller 702 sends a repair command (e.g., a power on read or other command resetting one or more memory die parameters) to each of the plurality of memory die. In another embodiment, memory controller 702 sends a repair command (e.g., a power on read or other command resetting one or more memory die parameters) only to the memory die that experienced a hard reset.

Figure 9C:
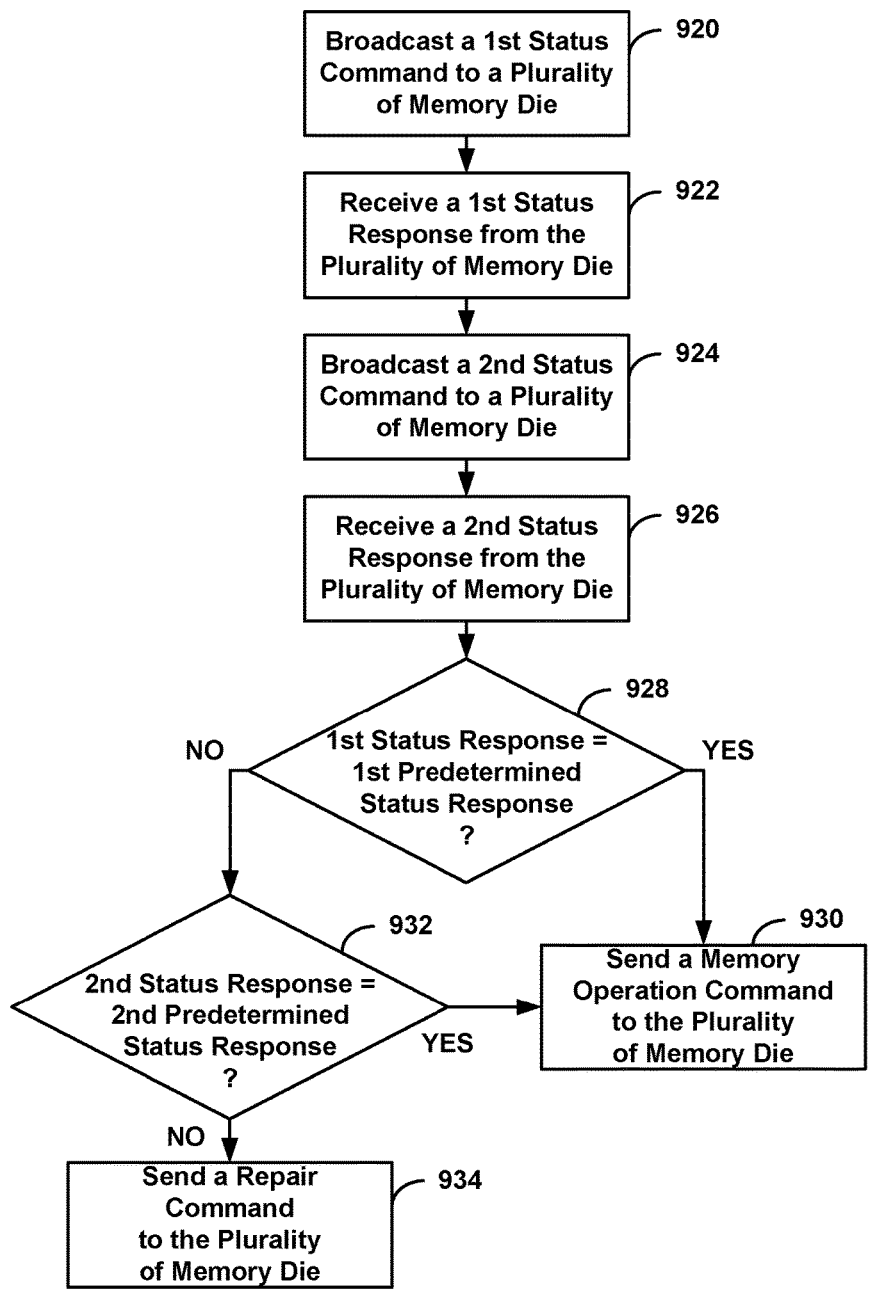
FIG. 9C is a flowchart describing still another embodiment of a process for concurrently acquiring status information from each memory die of a plurality of memory die.

FIG. 9C is a flowchart describing an embodiment of a process for concurrently acquiring status information from each memory die of a plurality of memory die using two status commands. In an embodiment, the process of FIG. 9B may be performed by a non-volatile storage system, such as memory system 101 in FIG. 2A.

In step 920, a first status command is transmitted to the plurality of memory die. In one embodiment, the first status command may be broadcast by a memory controller (e.g., memory controller 702 of FIG. 7A) over the shared I/O bus (e.g., IO_BUS[7:0] of FIG. 7A) to a plurality of memory die (e.g., DIE-0, . . . , DIE-7 of FIG. 7A) and direct each memory die of the plurality of memory die to transmit status information using the shared I/O bus.

In step 922, a first status response is concurrently received from each memory die of the plurality of memory die in response to transmitting the first status command. In one example, a first memory die of the plurality of memory die may drive a first bit of the shared I/O bus, a second memory die of the plurality of memory die may drive a second bit of the shared I/O bus, and so on during a status information cycle, forming a first status response that is received by memory controller 702.

In step 924, a second status command is transmitted to the plurality of memory die. In one embodiment, the second status command may be broadcast by a memory controller (e.g., memory controller 702 of FIG. 7A) over the shared I/O bus (e.g., IO_BUS[7:0] of FIG. 7A) to a plurality of memory die (e.g., DIE-0, . . . , DIE-7 of FIG. 7A) and direct each memory die of the plurality of memory die to transmit status information using the shared I/O bus.

In step 926, a second status response is concurrently received from each memory die of the plurality of memory die in response to transmitting the second status command. In one example, a first memory die of the plurality of memory die may drive a first bit of the shared I/O bus, a second memory die of the plurality of memory die may drive a second bit of the shared I/O bus, and so on during a status information cycle, forming a second status response that is received by memory controller 702.

In step 928, a determination is made whether the first status response satisfies first predetermined status criteria. For example, memory controller 702 may compare the first status response to a pattern of alternating 1s and 0s on the shared IO_BUS[7:0]. If the first status response satisfies first predetermined status criteria, at step 930 one or more memory operation commands are transmitted to the plurality of memory die. For example, memory controller 702 may transmit on the shared IO_BUS[7:0] one or more memory operation commands (e.g., read, write, erase) to the plurality of memory die.

If, however, the first status response does not satisfy first predetermined status criteria (e.g., one or more bits of the first status response are floating), at step 932, a determination is made whether the second status response equals a second predetermined status response. For example, memory controller 702 may compare the second status response to an inverted pattern of alternating 1s and 0s on the shared IO_BUS[7:0]. If the second status response satisfies second predetermined status criteria, at step 930 one or more memory operation commands are transmitted to the plurality of memory die. For example, memory controller 702 may transmit on the shared IO_BUS[7:0] one or more memory operation commands (e.g., read, write, erase) to the plurality of memory die.

If, however, the second status response does not satisfy second predetermined status criteria (e.g., one or more bits of the first status response are floating), at step 934, a repair command is sent to the plurality of memory die. In an embodiment, memory controller 702 sends a repair command (e.g., a power on read or other command resetting one or more memory die parameters) to each of the plurality of memory die. In another embodiment, at step 934 memory controller 702 identifies which dedicated IO bit(s) were not driven (e.g., floating), and sends a repair command (e.g., a power on read or other command resetting one or more memory die parameters) only to the identified memory die that did not respond to the first status command.

In the example process of FIG. 9C, if either the first status response satisfies first predetermined status criteria, or the second status response satisfies second predetermined status criteria, one or more memory operation commands are transmitted to the plurality of memory die. In other embodiments, one or more memory operation commands are transmitted to the plurality of memory die only if the first status response satisfies first predetermined status criteria, and the second status response satisfies second predetermined status criteria. In such a system, unless first and second predetermined status criteria are satisfied, a repair command (e.g., a power on read or other command resetting one or more memory die parameters) is sent to the plurality of memory die.

Figure 9D:
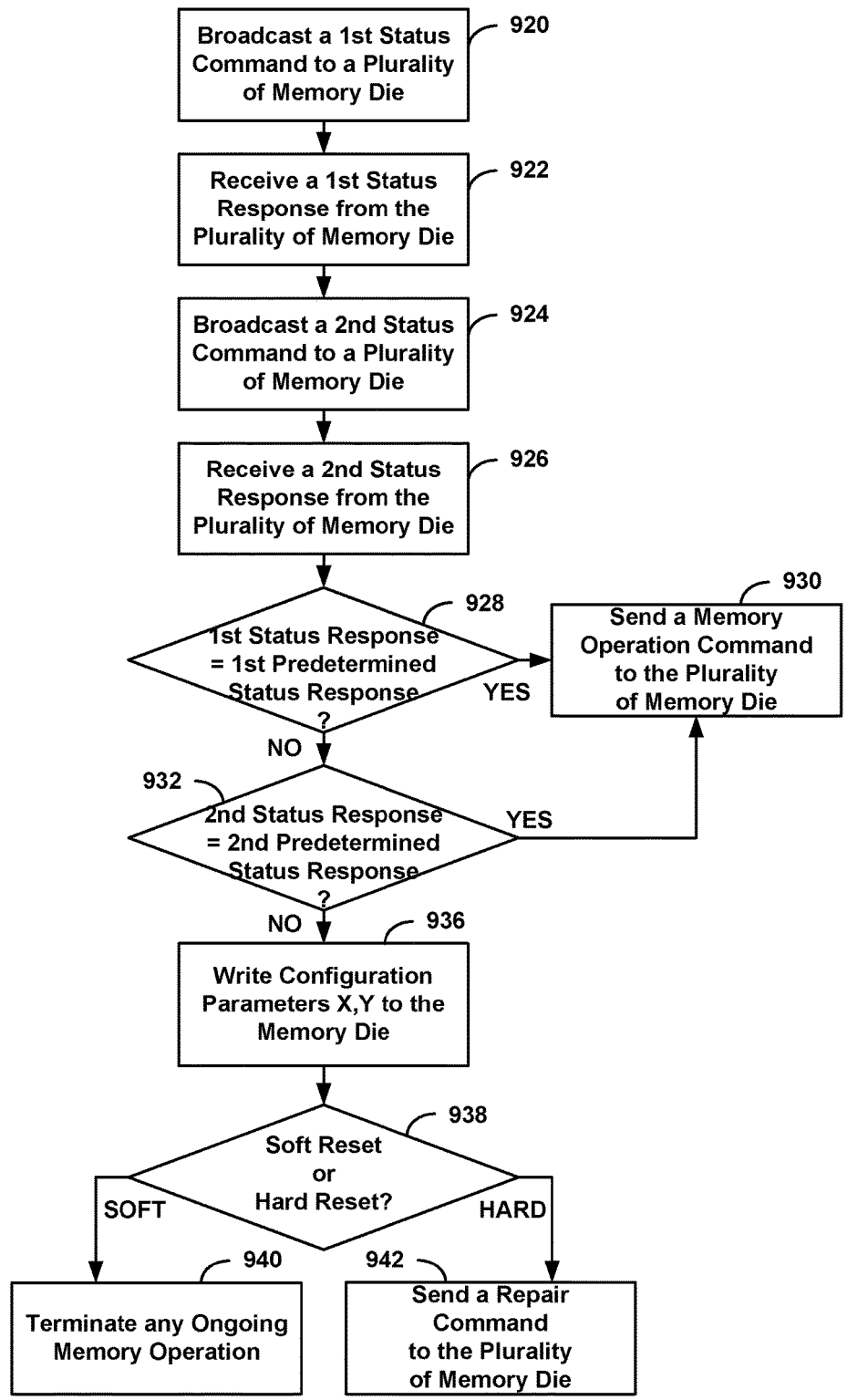
FIG. 9D is a flowchart describing another embodiment of a process for concurrently acquiring status information from each memory die of a plurality of memory die.

FIG. 9D is a flowchart describing another embodiment of a process for concurrently acquiring status information from each memory die of a plurality of memory die using two status commands. In an embodiment, the process of FIG. 9B may be performed by a non-volatile storage system, such as memory system 101 in FIG. 2A.

In step 920, a first status command is transmitted to the plurality of memory die. In one embodiment, the first status command may be broadcast by a memory controller (e.g., memory controller 702 of FIG. 7A) over the shared I/O bus (e.g., IO_BUS[7:0] of FIG. 7A) to a plurality of memory die (e.g., DIE-0, . . . , DIE-7 of FIG. 7A) and direct each memory die of the plurality of memory die to transmit status information using the shared I/O bus.

In step 922, a first status response is concurrently received from each memory die of the plurality of memory die in response to transmitting the first status command. In one example, a first memory die of the plurality of memory die may drive a first bit of the shared I/O bus, a second memory die of the plurality of memory die may drive a second bit of the shared I/O bus, and so on during a status information cycle, forming a first status response that is received by memory controller 702.

In step 924, a second status command is transmitted to the plurality of memory die. In one embodiment, the second status command may be broadcast by a memory controller (e.g., memory controller 702 of FIG. 7A) over the shared I/O bus (e.g., IO_BUS[7:0} of FIG. 7A) to a plurality of memory die (e.g., DIE-0, . . . , DIE-7 of FIG. 7A) and direct each memory die of the plurality of memory die to transmit status information using the shared I/O bus.

In step 926, a second status response is concurrently received from each memory die of the plurality of memory die in response to transmitting the second status command. In one example, a first memory die of the plurality of memory die may drive a first bit of the shared I/O bus, a second memory die of the plurality of memory die may drive a second bit of the shared I/O bus, and so on during a status information cycle, forming a second status response that is received by memory controller 702.

In step 928, a determination is made whether the first status response satisfies first predetermined status criteria. For example, memory controller 702 may compare the first status response to a pattern of alternating 1s and 0s on the shared IO_BUS[7:0]. If the first status response satisfies first predetermined status criteria, at step 930 one or more memory operation commands are transmitted to the plurality of memory die. For example, memory controller 702 may transmit on the shared IO_BUS[7:0] one or more memory operation commands (e.g., read, write, erase) to the plurality of memory die.

If, however, the first status response does not satisfy first predetermined status criteria (e.g., one or more bits of the first status response are floating), at step 932, a determination is made whether the second status response satisfies second predetermined status criteria. For example, memory controller 702 may compare the second status response to an inverted pattern of alternating 1s and 0s on the shared IO_BUS[7:0]. If the second status response satisfies second predetermined status criteria, at step 930 one or more memory operation commands are transmitted to the plurality of memory die. For example, memory controller 702 may transmit on the shared IO_BUS[7:0] one or more memory operation commands (e.g., read, write, erase) to the plurality of memory die.

If, however, the second status response does not satisfy second predetermined status criteria (e.g., one or more bits of the first status response are floating), at step 936, configuration parameters X,Y are written to the memory die. For example, memory controller 702 may write configuration parameters X,Y to each of the plurality of memory die. In another embodiment, at step 936 memory controller 702 identifies which dedicated IO bit(s) were not driven (e.g., floating), and writes configuration parameters X,Y only to the identified memory die that did not respond to the first and second status commands.

At step 938, for each of the identified non-responding memory die a determination is made whether the memory die experienced a predetermined unwanted event (e.g., a soft reset or a hard reset). For example, memory controller 702 may send status command CMD_HS to each of the identified memory die that did not respond to the first status command and the second status command, and in response, the identified memory die respond indicating whether they experienced a soft reset or a hard reset.

At step 940, a terminate operation command is sent to any memory die that experienced a soft reset. Because an ongoing memory operation may not have completed correctly prior to the soft reset, the ongoing memory operation is terminated.

At step 942, a repair command is sent to any memory die that experienced a hard reset. In an embodiment, memory controller 702 sends a repair command (e.g., a power on read or other command resetting one or more memory die parameters) to each of the plurality of memory die. In another embodiment, memory controller 702 sends a repair command (e.g., a power on read or other command resetting one or more memory die parameters) only to the memory die that experienced a hard reset.

In the example process of FIG. 9D, if either the first status response satisfies first predetermined status criteria, or the second status response satisfies second predetermined status criteria, one or more memory operation commands are transmitted to the plurality of memory die. In other embodiments, one or more memory operation commands are transmitted to the plurality of memory die only if the first status response satisfies first predetermined status criteria, and the second status response satisfies second predetermined status criteria. In such a system, unless first and second status responses satisfies first and second predetermined status criteria, respectively, a repair command is sent to the plurality of memory die.

One embodiment of the disclosed technology includes an apparatus including a plurality of memory die and a controller. The controller is configured to broadcast a first status command to the plurality of memory die, receive a first status response concurrently from the plurality of memory die based on the first status command, and send a repair command to one or more of the plurality of memory die in response to the first status response not satisfying first predetermined status criteria.

One embodiment of the disclosed technology includes a system including a plurality of memory die, a shared I/O bus coupled to each of the plurality of memory die, and a controller. The controller is configured to transmit a first status command over the shared I/O bus to each of the plurality of memory die, receive one bit of status information concurrently from each of the plurality of memory die based on the first status command, the received bits including a first status response, and send a repair command to any memory die that failed to respond to the first status command.

One embodiment of the disclosed technology includes a method including broadcasting a first status command to a plurality of memory die, each of the plurality of memory die configured to ignore the first status command in response to experiencing a predetermined unwanted event, receiving a first status response concurrently from the plurality of memory die based on the first status command, and sending a repair command to one or more of the plurality of memory die in response to the first status response not satisfying first predetermined status criteria.

One embodiment of the disclosed technology includes an apparatus including a plurality of memory die and a memory controller means. The memory controller means is configured to broadcast a first status command to the plurality of memory die, receive a first status response concurrently from the plurality of memory die based on the first status command, and send a repair command to one or more of the plurality of memory die in response to the first status response not satisfying first predetermined status criteria.

A memory controller means, in various embodiments, may include memory controller 105, memory controller 310, memory controller 702. Other embodiments may include similar or equivalent memory controller means for controlling the operation of a memory chip, such as memory chip 102, or memory system 101.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
a plurality of memory die; and
a memory controller configured to:
broadcast a first status command to the plurality of memory die;
receive a first status response concurrently from the plurality of memory die based on the first status command;
broadcast a second status command to the plurality of memory die;
receive a second status response concurrently from the plurality of memory die based on the second status command;
compare responses to the first status command to responses to the second status command to detect one or more memory die that no longer function properly and failed to respond to the status commands; and
send a reset command to the one or more memory die that failed to respond to the status commands to restore functionality to the one or more memory die.

2. The apparatus of claim 1, wherein the memory controller is further configured to send a memory operation command to the plurality of memory die in response to the first status response satisfying first predetermined status criteria.

3. The apparatus of claim 1, wherein the memory controller is further configured to send a memory operation command to the plurality of memory die in response to the second status response satisfying second predetermined status criteria.

4. The apparatus of claim 1, wherein the memory controller is further configured to identify memory die that fail to respond to the first status command.

5. The apparatus of claim 4, wherein the memory controller is further configured to:
determine that the identified memory die experienced a soft reset or a hard reset;
terminate an ongoing memory operation of the identified memory die that experienced a soft reset; and
send a reset command to the identified memory that experienced a hard reset.

6. The apparatus of claim 1, wherein the memory controller is further configured to:
send a reset command to the plurality of memory die if the first status response does not satisfy first predetermined status criteria and the second status response does not satisfy second predetermined status criteria.

7. The apparatus of claim 6, wherein the memory controller is configured to send a memory operation command to the plurality of memory die if the first status response satisfies first predetermined status criteria or the second status response satisfies second predetermined status criteria.

8. The apparatus of claim 6, wherein the memory controller is configured to send a power on read command to memory die that fail to respond to the first status command and the second status command.

9. The apparatus of claim 6, wherein the memory controller is further configured to identify memory die that fail to respond to the first status command and the second status command.

10. The apparatus of claim 9, wherein the memory controller is further configured to:
determine if the identified memory die experienced a soft reset or a hard reset;
terminate an ongoing memory operation of identified memory die that experienced a soft reset; and
send a reset command to identified memory that experienced a hard reset.

11. A system comprising:
a plurality of memory die; and
a memory controller configured to:
transmit a first status command to each of the plurality of memory die;
receive a first status response concurrently from each of the plurality of memory die based on the first status command; and
in response to one or more memory die no longer functioning properly and the first status response not satisfying first predetermined status criteria:
write configuration parameters to one or more of the plurality of memory die, wherein the configuration parameters specify a number of the plurality of memory die connected to a shared input/output bus; and send a power on read command to one or more of the plurality of memory die to restore functionality to the one or more memory die.

12. The system of claim 11, wherein the memory controller is further configured to transmit a subsequent memory operation command to the plurality of memory die if the first status response satisfies first predetermined status criteria.

13. The system of claim 11, wherein the memory controller is further configured to receive one bit of status information concurrently from each of the plurality of memory die based on the first status command, the received bits comprising the first status response.

14. The system of claim 11, wherein the memory controller is further configured to:
transmit a second status command to each of the plurality of memory die; and
receive one bit of status information concurrently from each of the plurality of memory die based on the second status command, the received bits comprising a second status response.

15. The system of claim 14, wherein the memory controller is further configured to transmit a subsequent memory operation command to the plurality of memory die if the first status response satisfies first predetermined status criteria or if the second status response satisfies second predetermined status criteria.

16. A method comprising:
broadcasting a first status command to a plurality of memory die, each memory die configured to respond to the first status command if the memory die has not experienced a power drop and to ignore the first status command if the memory die has experienced a power drop and no longer functions properly;
receiving a first status response concurrently from the plurality of memory die based on the first status command; and
resetting parameters of memory die that have ignored the first status command as a result of experiencing a power drop to restore functionality to the memory die that ignored the first status command.

17. The method of claim 16, further comprising terminating an ongoing memory operation of memory die in response to the first status response not satisfying first predetermined status criteria.

18. The method of claim 16, further comprising:
broadcasting a second status command to a plurality of memory die;
receiving a second status response concurrently from the plurality of memory die based on the second status command; and
resetting parameters of memory die that have ignored the first status command and the second status command as a result of experiencing a power drop.

19. The method of claim 18, further comprising sending a memory operation command to the plurality of memory die if the first status response satisfies first predetermined status criteria or the second status response satisfies second predetermined status criteria.

20. An apparatus comprising:
a plurality of memory die;
a shared I/O bus coupled to each of the plurality of memory die; and
a memory controller means configured to :
broadcast a first status command over the shared I/O bus to the plurality of memory die;
receive one bit of status information concurrently from the plurality of memory die based on the first status command, the received bits comprising a first status response; and
in response to one or more memory die no longer functioning properly and the first status response not satisfying first predetermined status criteria:
write configuration parameters to one or more of the plurality of memory die, wherein the configuration parameters specify a number of the plurality of memory die connected to a shared input/output bus; and
send a power on read command to one or more of the plurality of memory die to restore functionality to the one or more memory die.

* * * * *